United States Patent

Matsuda et al.

Patent Number: 6,068,755
Date of Patent: May 30, 2000

[54] PROCESS FOR FORMING ZINC OXIDE FILM AND PROCESSES FOR PRODUCING SEMICONDUCTOR DEVICE PLATE AND PHOTO-ELECTRICITY GENERATING DEVICE USING THE FILM

[75] Inventors: Koichi Matsuda, Ikoma; Yuichi Sonoda, Nara; Tetsuro Nakamura, Kyotanabe, all of Japan

[73] Assignee: Canon Kabushiki Kaisha, Tokyo, Japan

[21] Appl. No.: 08/986,826

[22] Filed: Dec. 8, 1997

[30] Foreign Application Priority Data

Dec. 6, 1996 [JP] Japan .................................... 8-326772

[51] Int. Cl.$^7$ ...................................................... C25D 9/00
[52] U.S. Cl. ............................................ 205/333; 205/155
[58] Field of Search ..................................... 205/124, 155, 205/316, 333

[56] References Cited

U.S. PATENT DOCUMENTS 5,635,860  6/1997  Nicholls et al. ........................... 205/80
5,804,466  9/1998  Arao et al. ................................ 438/95

FOREIGN PATENT DOCUMENTS 8217443  8/1996  Japan .

OTHER PUBLICATIONS

Masanobu Izaki et al, "Electrolyte Optimization for Cathodic Growth of Zinc Oxide Films," Journal of Electrochemistry Society, vol. 143, pp. L53–L55, Mar. 1996.

Inoue, Y., et al. "Optical Confinement Effect in a–SiGe Solar Cells on Stainless Steel Substrates," *Preprint (29p–MF–2) for the 51–th Academic Lecture of the Japan Society of Applied Physics*, p. 747, Autumn, 1990. No month available.

Sannomiya, H., et al., "a–SiC/a–Sila–SiGe Multi–Bandgap Stacked Solar Cells with Bandgap Profiling," *Technical Digest of the International PVSEC–5*, p. 381, 1990. No month available.

Izaki, Masanobu, et al., "Electrolyte Optimization for Cathodic Growth of Zinc Oxide Films," *J. Electrochem Society*, vol. 143, 1996, L53. No month available.

*Primary Examiner*—Kathryn Gorgos
*Assistant Examiner*—Erica Smith-Hicks
*Attorney, Agent, or Firm*—Fitzpatrick, Cella, Harper & Scinto

[57] ABSTRACT

A zinc oxide film is formed on an electroconductive substrate by electrodeposition. The electrodeposition is performed by immersing an electroconductive substrate and an electrode in an aqueous solution containing nitrate ion and zinc ion, and supplying a current passing through a gap between the electroconductive substrate and the electrode while vibrating the electroconductive substrate to stably form a uniform zinc oxide film free from anomalous growth of a crystal on the electroconductive substrate. The zinc oxide film is excellent in adhesive properties with the electroconductive substrate and suitable for a light-confining layer of a photo-electricity generating device.

70 Claims, 9 Drawing Sheets

PROCESS FOR FORMING ZINC OXIDE FILM AND PROCESSES FOR PRODUCING SEMICONDUCTOR DEVICE PLATE AND PHOTO-ELECTRICITY GENERATING DEVICE USING THE FILM

FIELD OF THE INVENTION AND RELATED ART

The present invention relates to a process for forming a zinc oxide film through crystal growth in liquid phase and processes for producing a plate for a semiconductor device and an photo-electricity generating device.

In a process for producing an electro-electricity generating device, it has been known that a reflection layer of, e.g., metal, is formed on the back side of a semiconductor layer in order to improve light-collection efficiency of the photo-electricity generating device on a long wavelength. Further, there has also been known that a transparent electroconductive layer having an unevenness is formed between the reflection layer and the semiconductor layer to obtain a light-confining (optical confinement) effect that an optical distance (optical path) of reflected light is elongated or lengthened to obtain an effect of suppressing an excessive current flowing at the time of an occurrence of a shunt passing. As the transparent electroconductive layer, there has been widely used an zinc oxide (ZnO) film formed by sputtering.

More specifically, by the use of the reflection layer and the zinc oxide layer in combination, an increase in short circuit current based on the light-confining effect has been achieved as described in, e.g., "Optical confinement Effect in a-SiGe solar cells on Stainless Steel Substrates", Preprint (29p-MF-2) for the 51-th Academic Lecture of The Japan Society of Applied Physics, p747, Autumn, 1990 or "P-IA-15a-SiC/a-Si/a-SiGe Miti-Bandgap Stacked Solar Cells with Bandgap Profiling" Sannomiya et al., Technical Digest of the International PVSEC-5, Kyoto, Japan, p381, 1990.

Further, it has been reported that the zinc oxide film is formed by electrolysis in an aqueous solution containing zinc ion ($Zn^{2+}$) and nitrate ion ($NO_3^-$) as in "Electrolyte Optimization for Cathodic Growth of Zinc Oxide Films", M. IZAKI and T. Omi, J. Electrochem. Soc., Vol. 143, March 1996, L53 or Japanese Laid-Open Patent Application (JP-A) 8-217443.

However, the former zinc oxide layer having the light-confining effect as described above is generally formed by a vacuum production process, such as vacuum deposition by using resistance heating or electron beam, sputtering, ion plating or chemical vapor deposition (CVD), thus being accompanied with problems, such as an expensive preparation cost of a target material, the necessity of using a vacuum process, a high repayment cost (amortization) of a vacuum apparatus, and a low utilization efficiency of the materials used. As a result, a photo-electricity generating device (e.g., solar cell) produced by the vacuum process becomes very expensive, thus constituting a barrier to industrial applications thereof.

The latter zinc oxide layer can be formed inexpensively by electrolysis in the aqueous solution containing zinc ion and nitrate ion but has the following problems (1)–(4).

(1) Particularly, in the case where a current density or a solution concentration is increased, an anomalous growth of a deposited (precipitated) crystal in the form of a needle, sphere or branch (dendritic growth) with a particle size above a micron order is liable to occur in the deposit. Accordingly, if the resultant zinc oxide film having such an anomalous growth portion is used as a part of the photo-electricity generating device, the anomalous growth portion may presumably be considered to induce a shunt passing phenomenon in the photo-electricity generating device.

The cause of the anomalous growth of the deposited crystal is not clear but this may be attributable to a local concentration of an electric field varying depending on the shape of an unevenness of a (cathode) substrate surface due to the use of the electrolysis, thus leading to the anomalous growth of the zinc oxide crystal at the electric field-concentrated portion. Further, although there is little gas generation at a cathode (substrate) in the case of the formation of the zinc oxide film, dissolved air is generated as minute bubbles when the solution temperature is 50° C. or above. The thus generated bubbles attach to the substrate surface, thus resulting in pits to cause recesses at the surface of the zinc oxide film. In the case where an electrolytic solution of a high concentration is used, a minute zinc hydroxide film is formed or deposited on the substrate even when electrolytic conditions are controlled. As a result, the anomalous growth may presumably be considered to occur from the minute film as a nucleus.

The particle size of the zinc oxide particles is considered to become small since the zinc oxide particles adsorbed to the substrate surface are quickly deposited thereon with an insufficient surface diffusion. Although the surface diffusion is improved by increasing the (electrolytic) solution temperature, the temperature increase is liable to cause the above-mentioned anomalous growth.

(2) The size of zinc oxide particles (crystal) is liable to fluctuate, thus leading to a uniformity in the resultant zinc oxide film of a large area.

(3) When the zinc oxide film is applied to a photo-electricity generating device, adhesive properties between the zinc oxide film and an underlying layer (electroconductive substrate) and/or between the zinc oxide film and an overlying layer (semiconductor layer) become insufficient.

(4) The resultant zinc oxide film has a smooth (flat) surface, thus failing to provide a surface in an appropriate uneven shape providing the light-confining effect.

SUMMARY OF THE INVENTION

In view of the above problems, an object of the present invention is to provide a process for stably forming a zinc oxide film on an electroconductive substrate by electrolytic deposition (electrodeposition), whereby adhesive properties between the zinc oxide film and a semiconductor layer disposed thereon are improved.

Another object of the present invention is to provide a process for forming a zinc oxide suitable for application to a light-confining layer of a photo-electricity generating device.

A further object of the present invention is to provide a process for producing a plate for a semiconductor device (element) including the zinc oxide film.

A still further object of the present invention is to provide a process for producing a photo-electricity generating device including the zinc oxide film.

According to the present invention, there is provided a process for forming a zinc oxide film, comprising:

immersing an electroconductive substrate and an electrode in an aqueous solution containing nitrate ion and zinc ion, and supplying a current passing through a gap between the electroconductive substrate and the electrode while vibrating the electroconductive substrate to form a zinc oxide film on the electroconductive substrate.

According to the present invention, there is also provided a process for producing a plate for a semiconductor device comprising an electroconductive substrate and a zinc oxide film formed thereon; said process comprising:

immersing an electroconductive substrate and an electrode in an aqueous solution containing nitrate ion and zinc ion, and supplying a current passing through a gap between the electroconductive substrate and the electrode while vibrating the electroconductive substrate to form a zinc oxide film on the electroconductive substrate.

According to the present invention, there is further provided a process for producing a photo-electricity generating device, comprising:

immersing an electroconductive substrate and an electrode in an aqueous solution containing nitrate ion and zinc ion, supplying a current passing through a gap between the electroconductive substrate and the electrode while vibrating the electroconductive substrate to form a zinc oxide film on the electroconductive substrate; and forming a semiconductor layer on the zinc oxide film.

By the above-mentioned processes, anomalous growth of a crystal for constituting the zinc oxide film is effectively suppressed. Further, by an intense vibration, an ion concentration distribution in an electrolytic solution in the vicinity of the substrate surface is sufficiently uniformized and surface diffusion of adsorbed zinc oxide particles at the film-forming surface are activated, thus allowing the formation of a homogeneous zinc oxide film having a large and uniform crystal particle size.

It is also possible to prevent peeling-off of the zinc oxide film resulting from the anomalous growth by suppressing the occurrence of the anomalous growth, thus improving the adhesive properties between the electroconductive substrate and the zinc oxide film.

In the case where the zinc oxide film is used for constituting a photo-electricity conversion device, adhesive properties of the zinc oxide film with an overlying semiconductor layer can be enhanced. Particularly, when a continuous electroconductive substrate is used, the substrate is wound into a roll after the film formation, so that the adhesive properties between the electroconductive substrate and the zinc oxide film or between the zinc oxide film portions are a important factor. Further, the improvement in adhesive properties leads to an improvement in production yield of the photo-electricity generating device.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 6A and 6B are respectively a schematic illustration of line of magnetic force in the vicinity of an electroconductive substrate in contact with the rotating belt-shaped vibrating member shown in FIG. 4, wherein FIG. 6B is an embodiment using an opposite magnet.

DESCRIPTION OF THE PREFERRED EMBODIMENTS

Figure 1:
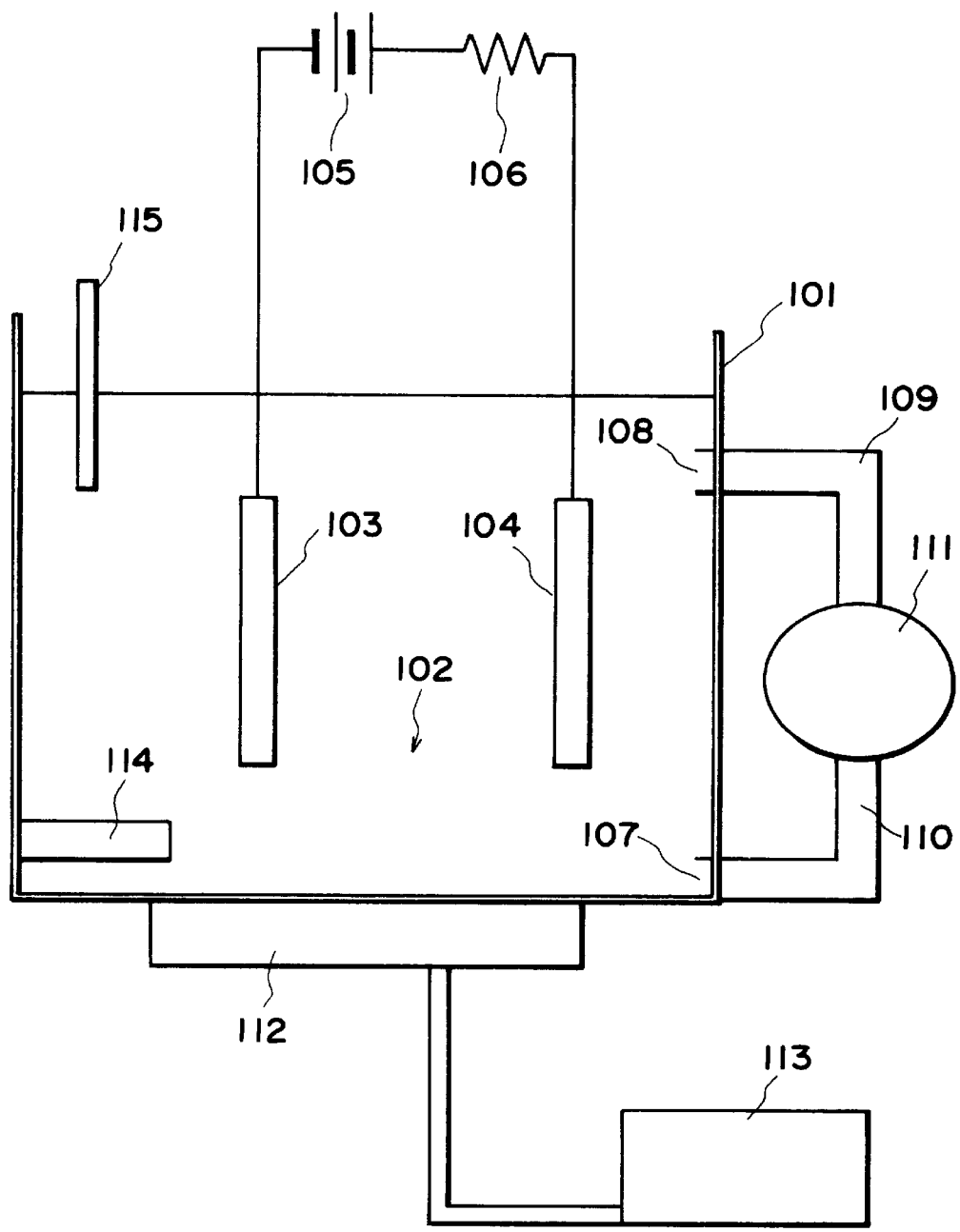
FIG. 1 is a schematic sectional view showing an embodiment of a zinc oxide film forming apparatus using an ultrasonic oscillator.

In the processes according to the present invention, the electroconductive substrate is vibrated directly or indirectly for forming a uniform zinc oxide film thereon based on an electrolytic deposition (electrodeposition).

More specifically, the electroconductive substrate is directly vibrated by disposing a vibrating member in immediate contact with the electroconductive substrate.

Further, the electroconductive substrate is indirectly vibrated by disposing an ultrasonic oscillator apart from the electroconductive substrate (e.g., disposing the ultrasonic oscillator under an electrolytic tank) and transmitting vibration (or ultrasonic wave) of the ultrasonic oscillator to the electroconductive substrate via an aqueous solution (as an electrolytic solution).

In this instance, the vibration by the ultrasonic oscillator provides a high-speed stirring effect based on cavitation caused by ultrasonic waves. The ultrasonic oscillator may preferably provide ultrasonic waves having a frequency of 20–100 kHz wherein a larger cavitation effect is obtained, thus uniformizing a concentration of the aqueous solution in the vicinity of the electroconductive substrate surface where an electrolytic reaction (electrodeposition) is caused. Particularly, a particle size of a zinc oxide crystal deposited on the electroconductive substrate is effectively controlled so as not to cause anomalous growth providing a particle size of above 20 $\mu$m.

The direct vibration of the electroconductive substrate disposed in contact with the vibrating member may, e.g., be performed by transmitting a power of a motor to the substrate through a crank. When the substrate is in a continuous shape, a part of a rotating belt-shaped vibrating member is caused to closely contact with the back side of the continuous electroconductive substrate while being moved in a direction identical to the moving direction of the substrate, thus vibrating the substrate.

By the close contact of the rotating belt-shaped vibrating member with the electroconductive substrate, the electroconductive substrate is efficiently vibrated to sufficiently stir or diffuse ions at the substrate surface. Further, the vibration is effected while moving the rotating belt-shaped vibrating member and the continuous electroconductive substrate in the same direction, thus effectively transmitting the vibration to the substrate with no scars due to a friction between the substrate and the vibrating member. As a result, production yields of subsequent steps for producing a photo-electricity generating device can be improved.

In the present invention, the vibrating member may desirably be a rotating belt comprising a magnetic material (particularly a ferromagnetic material) wherein a part or all thereof is magnetized, so that when the vibrating member is caused to closely contact with the continuous electroconductive substrate and moved in the same direction as the moving direction of the substrate, the vibration by the vibrating member can effectively be transmitted to the substrate compared with the case where the vibrating member is pressed against a tensed substrate. Further, the use of such a magnetic rotating belt allows a change in direction of a film-forming surface of the continuous electroconductive substrate with no contact thereof with the roller(s) after the substrate is once taken out from the aqueous solution when the substrate is immersed in plural aqueous solutions to form thereon a multi layer-type zinc oxide film. At this time, the electroconductive substrate intimately contacts with the magnetic rotating belt, whereby the electroconductive substrate can be wound or drawn up into a coil (roll) with a high tension, thus facilitating the handling of the coil (electroconductive substrate) after the formation of the zinc oxide film (electroconductive oxide film).

In a more preferred embodiment, a magnetic (ferromagnetic) member is disposed opposite to the electroconductive substrate so that lines of magnetic force are perpendicular to the electroconductive substrate. When the magnetic force lines of the magnetic member are perpendicular to the substrate, the movement of ions in the aqueous solution becomes uniform over the entire width direction, thus providing a resultant zinc oxide film with an excellent uniformity (homogeneity) in film properties. The uniform film properties of the zinc oxide film make the photo-electric conversion efficiency of a photo-electric conversion element (member) formed thereon more uniform.

In the present invention, the vibrating member may preferably have a frequency of 1 Hz–100 kHz and an amplitude of 1 $\mu$m–100 mm. Further, the vibrating member may preferably provide a vibration wave transmitted at an average speed of at most 10 m/sec.

In the case where a zinc oxide film consisting of a first zinc oxide layer and a second zinc oxide layer is formed on the above-mentioned electroconductive substrate, the electrodeposition may preferably be performed by using a first electrolytic tank containing a first zinc nitrate aqueous solution and a first vibrating member and a second electrolytic tank containing a second zinc nitrate aqueous solution and a second vibrating member in combination under the condition that the frequency and/or vibrating direction of the first vibrating member may preferably be set so as to be different from those of the second vibrating member.

The first zinc oxide layer is formed on the electroconductive substrate by depositing the zinc oxide particles under conditions providing a larger surface unevenness excellent in optical performances but is partially accompanied with pits and/or anomalously high projections. The second zinc oxide layer is formed on the first zinc oxide layer so as to cover or moderate such pits and/or projections, thus improving the production yield of the photo-electricity generating device without lowering optical and electrical performances of the resultant zinc oxide film.

Further, after a dense and flat layer is formed as the first zinc oxide layer, the second zinc oxide layer is formed in a small thickness with an appropriate surface unevenness. As a result, the photo-electricity generating device with excellent optical and electric performances can be prepared with a good production yield.

Further, after a dense and flat first zinc oxide layer is formed, the second zinc oxide layer is formed under conditions providing shallow pits and is subjected to etching to provide a desired surface shape, thus improving the production yield, durability and matter resistance of the photo-electricity generating device with no lowering in optical and electric performances.

In the present invention, the zinc oxide film may preferably have a surface unevenness in a height of 0.01–2 $\mu$m.

The aqueous solution used in the present invention may preferably have a zinc nitrate concentration of 0.05–1.0 mol/l. Below 0.05 mol/l, the zinc oxide crystal is not deposited on the electroconductive substrate and (metallic) zinc crystal is deposited thereon in some cases. Anomalous growth of zinc oxide crystals may occur when an aqueous solution having zinc nitrate concentrations above 1.0 mol./L is used. When the zinc nitrate concentration is 0.05–1.0 mol/l, a position of the strongest peak in an X-ray diffraction pattern is shifted from a position <002> (at the concentration below 0.05 mol/l) to a position <001>, whereby the surface shape of the zinc oxide film is correspondingly changed from a flat (smooth) state to an uneven state, thus being suitable for a light-confining layer for the photo-electricity generating device.

In the present invention, a current applied so as to pass through a gap between the electroconductive substrate and a counter electrode may preferably have a current density of 10 mA/dm$^2$–10 A/dm$^2$. Below 10 mA/dm$^2$, the zinc oxide crystal is not readily deposited. Above 10 A/dm$^2$, the anomalous growth of the crystal is liable to occur.

The zinc oxide film may preferably be formed by electrodeposition (electrolytic deposition in liquid phase) at a temperature (of the aqueous solution) of at least 50° C., thus stably effecting a zinc oxide-forming reaction.

As a pretreatment for the electrodeposition, the electroconductive substrate may preferably be heated to have a temperature which is within ±5° C. of the aqueous solution temperature, whereby the anomalous growth due to an irregularity in the surface temperature of the electroconductive substrate immediately after the initiation of the electrodeposition operation can effectively be prevented, thus stably initiating a deposition reaction in liquid phase.

The aqueous solution may preferably contain a carbohydrate since the carbohydrate generates hydrogen to function as a buffer suppressing an increase of a pH of the aqueous solution, thus stably controlling the zinc oxide-forming reaction to regulate a particle size of the zinc oxide crystal.

Examples of such a carbohydrate may include glucose, saccharose, cellulose and starch.

Hereinbelow, some apparatus applicable to the process for forming an zinc oxide according to the present invention will be described specifically based on FIGS. 1–6.

FIG. 1 shows an embodiment of a production apparatus for forming an zinc oxide film used in the present invention.

The apparatus generally includes an electrolytic tank (corrosion-resistant tank) 101 an electrolytic solution (aqueous solution) 102 containing nitrate ion ($NO_3^-$), zinc ion ($Zn^{2+}$) and a carbohydrate; an electroconductive substrate 103 as a cathode; a counter electrode 104 as an anode;

and an ultrasonic oscillator (oscillating or vibrating member) 112 disposed under the tank 101.

In the aqueous solution 102, each of a nitrate ion concentration and a zinc ion concentration ay preferably be 0.005–1.0 mol/l.

The aqueous solution 102 may preferably comprise an aqueous solution containing zinc nitrate providing both ions (nitrate ion and zinc ion) and an aqueous solution containing a mixture of a nitrate (e.g., ammonium nitrate) and a zinc salt (e.g., zinc sulfate).

The counter electrode 104 may comprise zinc (to be deposited in liquid phase on the electroconductive substrate 103), platinum an carbon. The counter electrode 104 is electrically connected to the electroconductive substrate 103 via a load resistance 106 and a power supply 105, thus providing a constant current. The current may preferably be set to provide a current density of 10 mA/dm$^2$–10 A/dm$^2$ in order to form a desired zinc oxide film.

The ultrasonic oscillator 112 is connected to an ultrasonic generator 113 and transmits vibration (ultrasonic wave) generated by the generator 113 to the electroconductive substrate 103 via the aqueous solution 102. The ultrasonic wave may preferably have a frequency of 20–100 kHz.

Figure 2A:
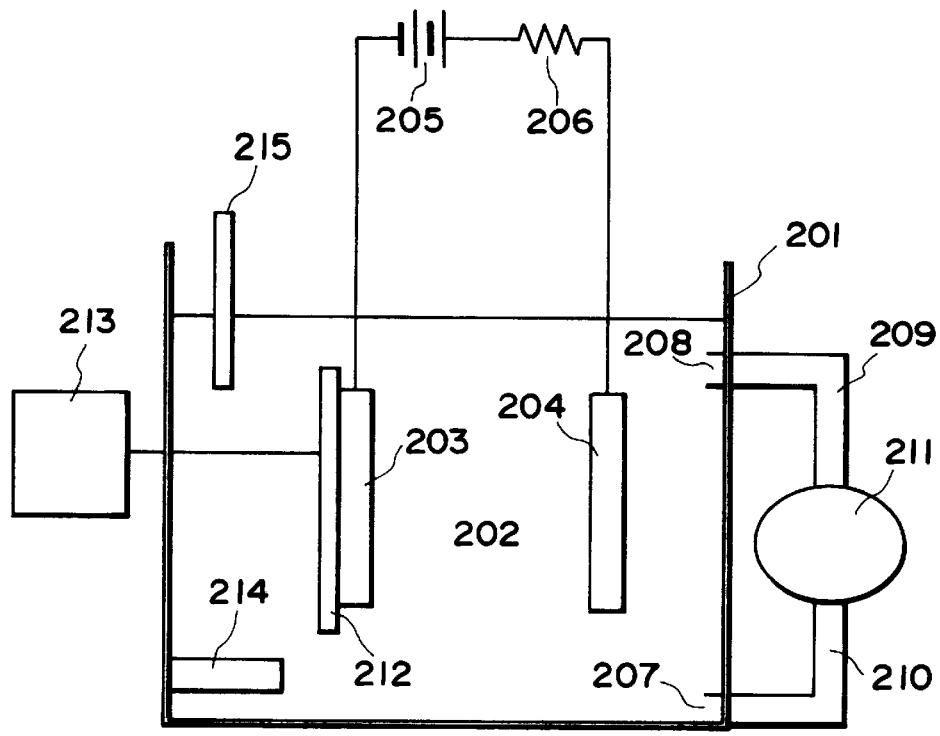
FIG. 2A is a schematic sectional view showing an embodiment of a zinc oxide film forming apparatus using a vibrating member.

FIG. 2A shows another embodiment of a production apparatus for forming a zinc oxide film used in the present invention principally including structural members 201–206 similar to those 101–106 shown in FIG. 1.

The apparatus shown in FIG. 2A includes a vibrating member 212 in a plate (sheet) shape disposed in contact with the electroconductive substrate 203 and directly transmits variation (ultrasonic wave) to the electroconductive substrate. By the contact of the vibrating member 212 with the electroconductive substrate 203, it is possible to provide vibrations (reciprocating motions) in directions parallel and perpendicular to the electroconductive substrate 203. The variations may be generated and/or transmitted by a driving mechanism in which a power of a motor is converted into the reciprocating motions in respective (parallel and perpendicular) directions by using gear(s) and crank(s) in combination. The driving mechanism may be provided inside the vibrating member 212 or a vibration power supply 213. The vibrating member 212 may be provided inside the power supply 213.

Figure 2B:
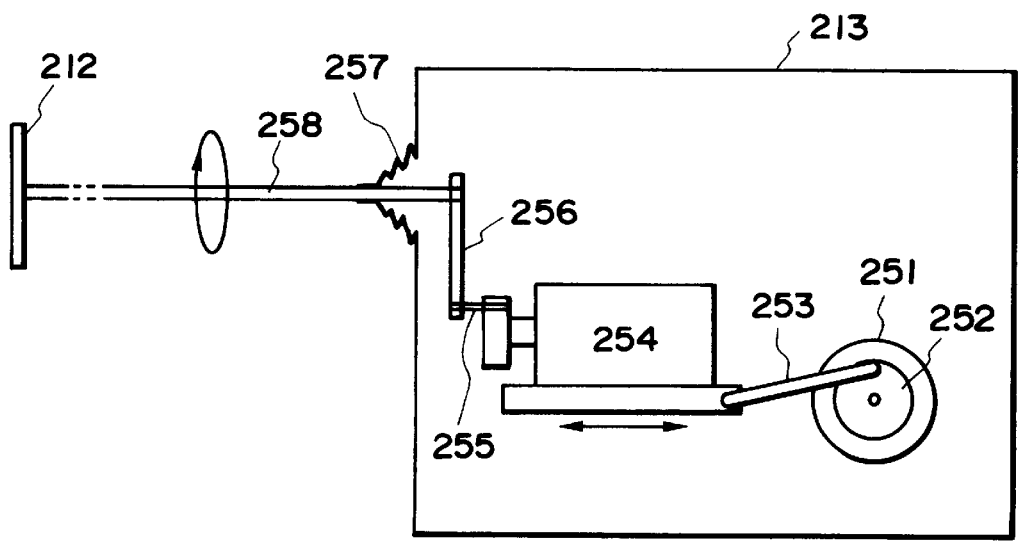
FIG. 2B is an enlarged sectional view of a power supply for the vibrating member.

FIG. 2B shows an embodiment of the vibration power supply 213 including the driving mechanism.

In the vibration power supply 213, a first motor 251 including a rotating plate 252 exerts a vibration in a direction perpendicular to the electroconductive substrate 203 on a second motor 254 via a crank 253 connecting the rotating plate 252 (of the first motor 251) and the second motor 254. The second motor 254 generates a vibration in a direction parallel to the electroconductive substrate 203 through a crank shaft 255 and a crank 256 and transmits the vibration to the electroconductive substrate 203 through a vibration transmission shaft 258 connected with the crank 256 between which a rubber seal 257 is disposed.

The vibrating member 212 may comprise a ultrasonic oscillator.

Further, the vibration power supply 213 may be disposed within the electrolytic tank 201.

The vibration wave may preferably have a frequency of 1 Hz–100 kHz and an amplitude of 1 μm–100 mm in the parallel and perpendicular directions, respectively. The vibration wave may desirably be transmitted at an average speed of 10 m/sec. in the parallel and perpendicular directions, respectively.

In the case where the above-mentioned ultrasonic oscillator is used, the vibration amplitude is generally small (e.g., several μm), so that a standing wave has a larger pitch to cause uneven (ununiform) ion stirring or diffusion although the ion stirring at the surface of the electroconductive substrate is effectively performed based on the ultrasonic cavitation effect. In view of this problem, two oscillators having different resonance frequencies f1 (kHz) and f2 (kHz) may be provided and used so as to generate a vibration wave having frequencies f1±Δf (kHz) and f2±Δf (kHz) somewhat different from those (f1 and f2), respectively. Alternatively, a method of sweeping the frequency(ies) (in parallel and/or perpendicular direction) in a certain range or of modulating the frequency(ies) (in parallel and/or perpendicular direction) so as not to provide a constant value through-out the electrodeposition operation may be adopted. By these methods, the cavitation position can be continuously changed, thus suppressing the uneven ion stirring to provide a zinc oxide film comprising uniform and larger particles of the zinc oxide crystal.

In order to decrease an uneven film formation and efficiently improve the film-forming speed by the stirring of the aqueous solution, a solution circulating system including a solution entrance port 108 (208), a solution exhaust port 107 (207), an inlet or suction pipe 109 (209), an exhaust pipe 110 (210) and a circulating pump 111 (211) as shown in FIG. 1 or 2A may preferably be used. Instead of the solution circulating system, a magnetic stirrer may be used.

The temperature of the aqueous solution 102 (202) may preferably be regulated at at least 50° C. by using a heater 114 (214) and a thermometer 115 (215) (e.g., a thermocouple) for monitoring the solution temperature in combination, thus obtaining a desired zinc oxide film.

The electroconductive substrate 103 (203) may preferably be heated to have a temperature identical to the solution temperature, in advance of the electrodeposition step.

In the present invention, the zinc oxide film may be formed in a first zinc oxide layer and a second zinc oxide layer under appropriate electrodeposition conditions. The second zinc oxide layer may be formed on the first zinc oxide layer under conditions different from those for the first zinc oxide layer.

In order to stably suppressing the anomalous growth of the zinc oxide crystal, it is possible to add in the aqueous solution 102 (202) a carbohydrate such as a monosaccharide, a disaccharide or poly-saccharide. Examples of the monosaccharide may include gulcose (grape sugar) and fructose (fruit sugar). Examples of the disaccharide may include maltose (malt sugar) and saccharide (sucrose or cane sugar). Examples of the polysaccharide may include dextrin and starch.

The aqueous solution 102 (202) may preferably contain the carbohydrate in a concentration of 0.001–300 g/l, more preferably 0.005–100 g/l, particularly 0.01–60 g/l, in order to obtain a zinc oxide film excellent in homogeneity and adhesive properties while suppressing the anomalous growth.

Figure 3:
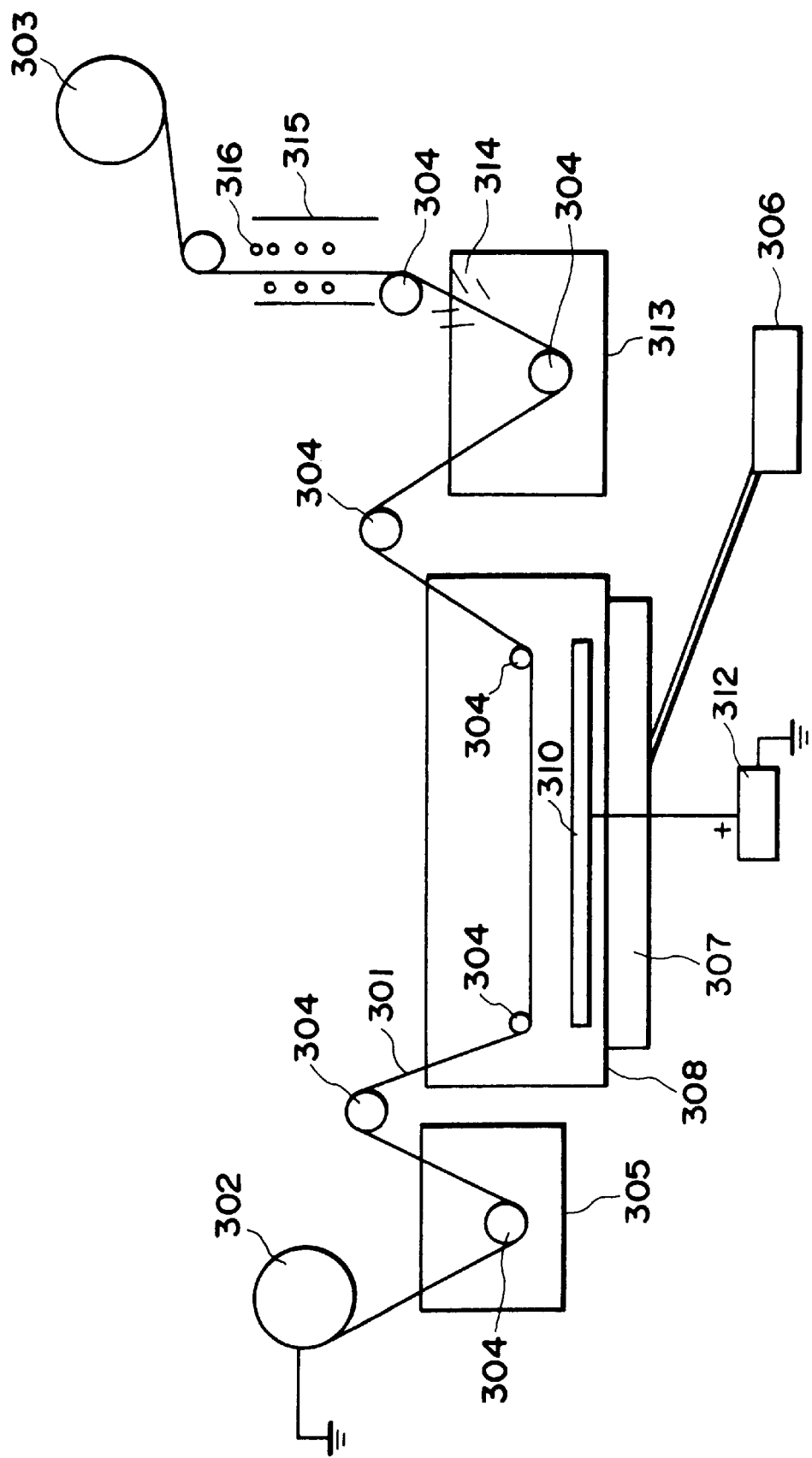
FIGS. 3 and 4 are respectively a schematic sectional view showing a continuous zinc oxide film forming apparatus using a ultrasonic oscillator (FIG. 3) or a magnetic vibrating member in a rotating belt shape (FIG. 4).
Figure 4:
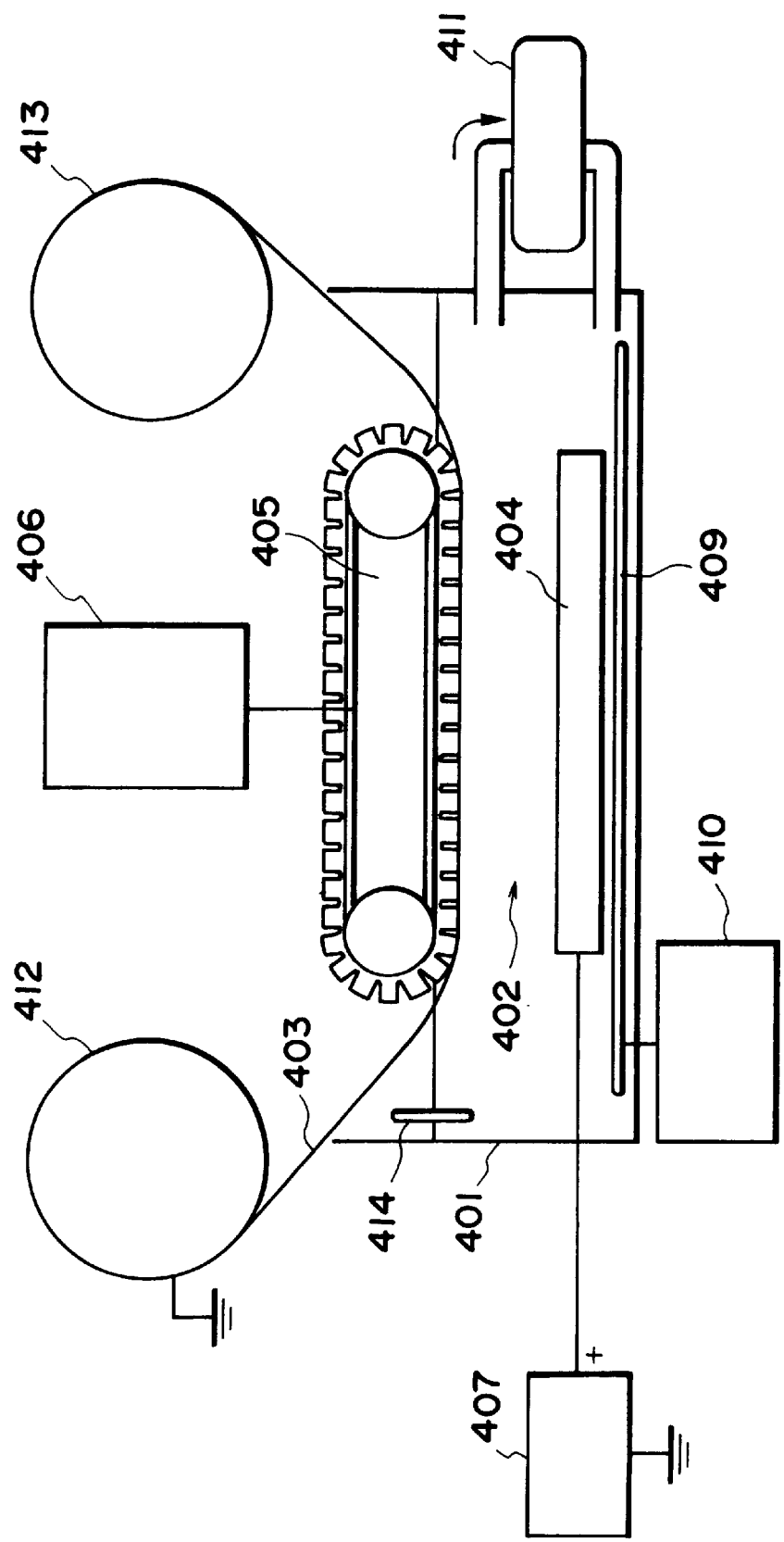

FIGS. 3 and 4 respectively show an embodiment of an apparatus for forming an zinc oxide layer on a continuous electroconductive substrate in a flexible sheet shape.

The apparatus shown in FIG. 3 include an ultrasonic oscillator 307 and an ultrasonic generator 306 connected with the ultrasonic oscillator 307, whereby vibration (ultrasonic wave) is transmitted indirectly to a continuous electroconductive substrate 301 via an aqueous solution (not shown) within a zinc-oxide-forming tank 308. On the backside of the electroconductive substrate 301, an insulating tape (not shown) is applied so as to prevent (electro-) deposition of the zinc oxide crystal.

In the apparatus, the electroconductive substrate 301 is supplied from a lead-on (delivery) roller 302 about which the electroconductive substrate 301 is wound, and is wound up by a wind-up (take-up) roller 303 via conveyance rollers 304. Outer diameters of the respective rollers 302, 303 and 304 may appropriately be set depending on a material for the electroconductive substrate 301 so as to prevent plastic deformation.

First, the electroconductive substrate 301 is supplied to a warm water tank 305 for heating the electroconductive substrate 301, wherein a heater (not shown) is disposed. The tank 305 is connected to a circulating system including a filter for removing dust and contamination in the warm water (not shown).

Then, the electroconductive substrate 301 is supplied to the zinc oxide-forming tank 308 to which a circulating system (not shown) including a dust-removing filter similarly as in the warm water tank 305 is connected. The circulating system includes a system for monitoring a concentration of the aqueous solution and appropriately supplementing a fresh aqueous solution (not shown). Inside the tank 308, a counter electrode 310 are disposed opposite to the electroconductive substrate 301 and a heater (not shown) is disposed and connected to an external power supply 312.

Under the bottom of the tank 308, the ultrasonic oscillator 307 is connected with the utrasonic generator 306.

After the electrodeposition in the tank 308, the electroconductive substrate 301 having thereon the zinc oxide film is supplied to a water washing tank 313 to which a circulating system (not shown) including a dust-removing filter similarly as in the tanks 305 and 308 is connected. The electroconductive substrate 301 is washed by water shower 314 and dried by a drying means 315 provided with infrared heaters 316, followed by wind-up by the wind-up roller 303.

Referring to FIG. 4, the apparatus includes a vibrating member 405 in a rotating belt-shape disposed directly in contact with a continuous electroconductive substrate 403 (similar to the electroconductive substrate 301 in FIG. 3).

The apparatus include a zinc oxide fil-forming tank 401 containing therein an aqueous solution 402 (as an electrolytic solution) containing nitrate ion, zinc ion and a carbohydrate.

In the apparatus, a continuous electroconductive substrate 403 (as a cathode) is supplied from a lead-on roller 412 and wound up by a wind-up roller 413 via a rotating belt-shaped vibrating member 405. A counter electrode 404 of Zn (as an anode) is electrically connected with a power supply 407 so as to provide a substantially constant current. At a bottom of the tank 401, a heater 409 for keeping a solution temperature constant is disposed and is connected to a power supply 410 for the heater, thus regulating the solution temperature so as to become a given constant temperature. Further, in order to uniformly stir the aqueous solution 402 to minimize an uneven film formation and efficiently improve a film-forming speed, a solution-circulating system comprising a circulating pump 411 and inlet and exhaust pipes is employed, thus circulating the solution 402 in the direction of an arrow shown in FIG. 4 to improve a stirring efficiency. Further, in order not to cause a temperature distribution (difference) in the solution 402 due to convection generated by the heater 409, a sitter may optionally be used.

The rotating belt-shaped vibrating member 405 is connected with a power supply 406 therefor and is disposed in immediately contact with the backside of the electroconductive substrate 403, whereby reciprocating motions in two directions parallel to and perpendicular to the electroconductive substrate 403 are caused.

If the vibrating member 405 is placed in a static state, scars are liable to occur in the perpendicular direction (to the substrate 403), thus leading to a fatal defect to a resultant device. For this reason, the rotating belt-shaped vibrating member 405 is used in a moving state so as to provide a moving (rotating) speed identical to a moving speed of the substrate 403, thus transmitting vibration to the substrate 403 while pressing itself against the substrate 403 to be floated up.

In the present invention, the rotating belt-shaped vibrating member may have magnetic properties so as to convey the electroconductive substrate 403 by magnetic force.

Figure 5:
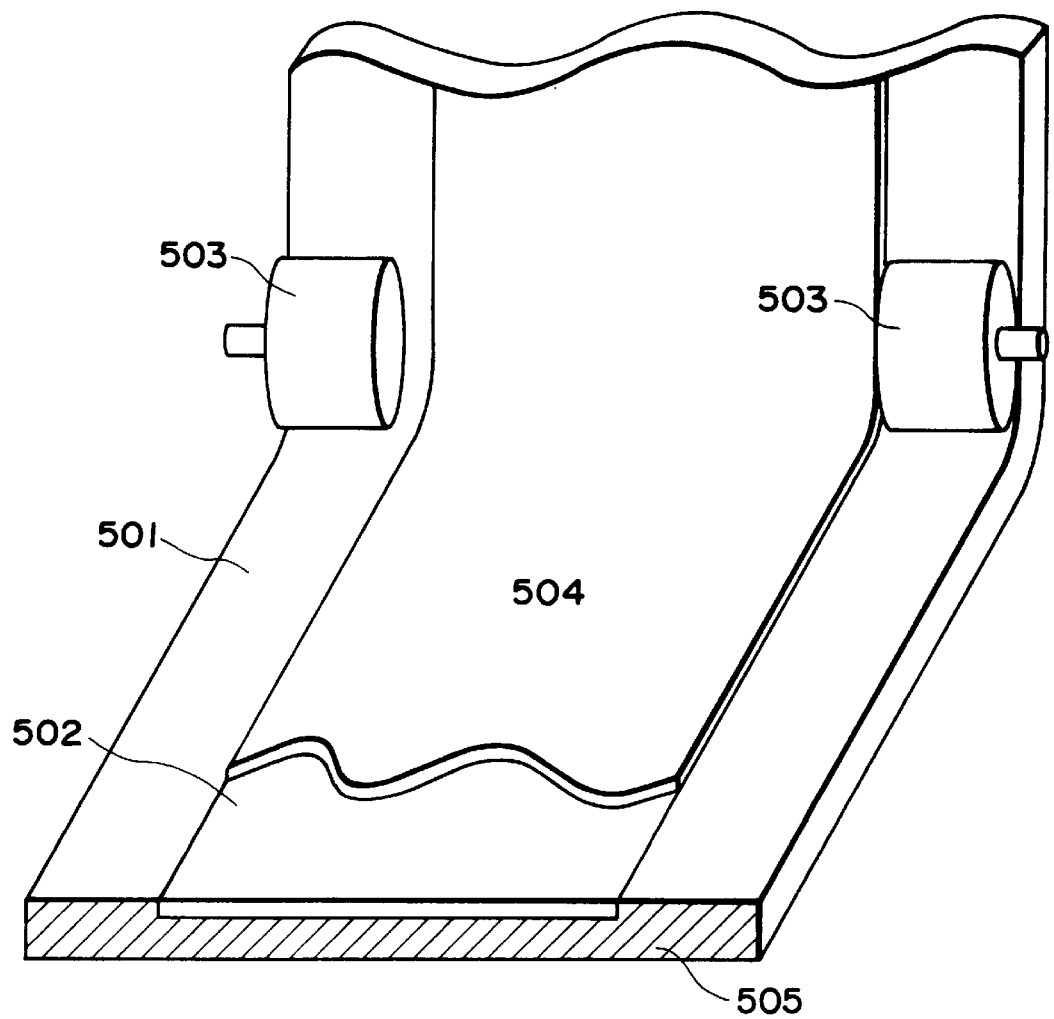
FIG. 5 is an enlarged perspective view of the rotating belt-shaped vibrating member shown in FIG. 4.

FIG. 5 shows an embodiment of a magnetic (ferromagnetic) rotating belt 501.

The magnetic rotating belt 501 may generally be formed by dispersing a ferromagnetic (magnetized) material in a binder rubber and forming a resultant mixture in a rotary belt form.

Examples of the binder rubber may include silicon rubber, fluorine-containing rubber, urethane rubber, nitrile rubber, styrene-based rubber, and butyl rubber.

Examples of the ferromagnetic material may include quench hardening magnets, such as tungsten steel; precipitation hardening magnets, such as alnico aluminum-nickel-cobalt alloy; rare-earth-cobalt magnets; and oxide magnets.

As shown in FIG. 5, the magnetic rotating belt 501 is provided with a recess portion 505 (hatched portion having a recessed surface in FIG. 5). corresponding to the shape (width and thickness) of a continuous electroconductive substrate 502, thus suppressing a positional deviation (shift) of the substrate 502. The backside of the substrate 502 contacts with the rotating belt 501, thus forming a zinc oxide film 504 only at the upper (exposed) surface.

The rotating belt 501 has a sufficient width and strength and is provided with two edge-supporting rollers 503 (corr. to rollers 1029 shown in FIG. 10) at opposite lateral end portions where the electroconductive substrate 502 is located, whereby the electroconductive substrate 502 can be changed in its moving (conveyance) direction without deforming its shape and contacting the rollers 503. The rollers 503 may be a single roller or three or more rollers.

Figure 6B:
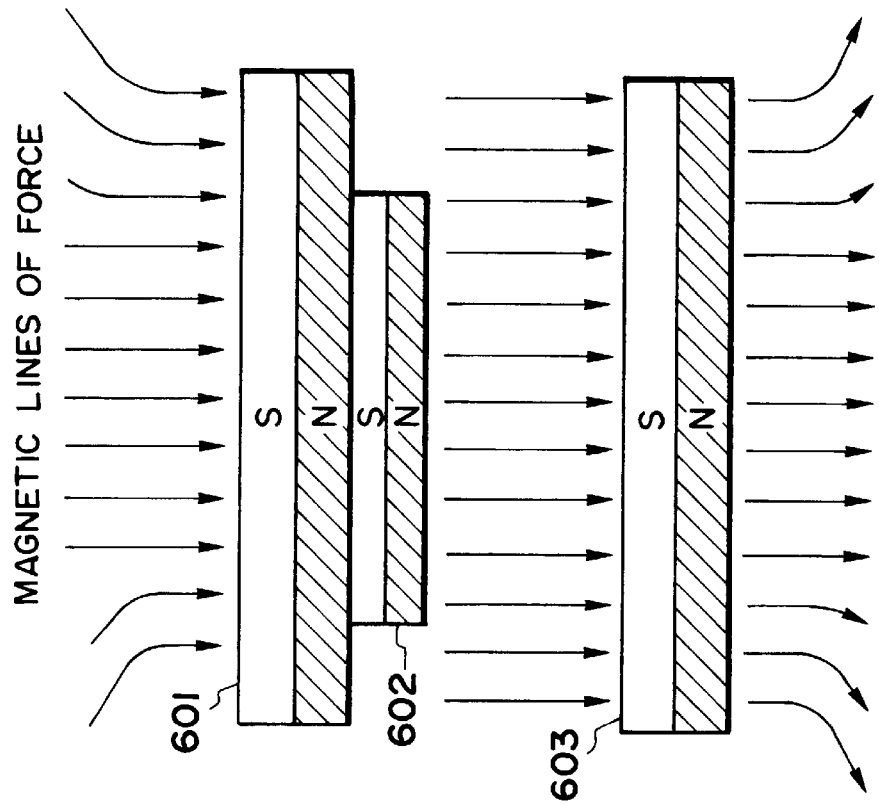
Figure 6A:
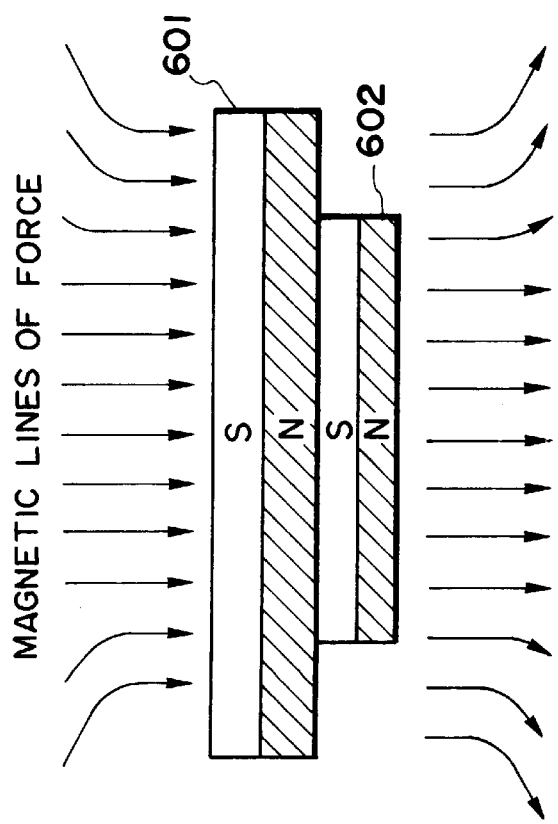

FIGS. 6A and 6B respectively show a behavior (state) of magnetic lines of force, wherein FIG. 6A represent the case where a counter (opposite) magnet of a ferromagnetic material is not disposed at the bottom of the zinc oxide film-forming (electrolytic) tank and FIG. 6 represents the case where the counter magnet is disposed at the bottom of the tank.

Referring to FIG. 6A, the density of the magnetic lines of force at a central portion of the rotating belt 601 is different from that at peripheral (edge) portions thereof although the rotating belt 601 has a width sufficiently larger than the electroconductive substrate 602, thus adversely affecting ions within the aqueous solution under electric field application to cause, e.g., an ununiform thickness of a resultant zinc oxide film.

On the other hand, as shown in FIG. 6B, when the counter magnet 603 disposed opposite to the rotating belt 601 contacting with the electroconductive substrate 602 is used, the magnetic lines of force located between the magnetic rotating belt 601 and the counter magnet 603 are substantially parallel to each other, thus not adversely affecting the thickness and homogeneity of the resultant zinc oxide film to allow a uniform film formation.

In the present invention, the apparatus shown in FIG. 4 may further include a warm water tank (e.g., the tank 305 shown in FIG. 3) for pre-heating the electroconductive substrate 403 before the film-forming step, and a water washing tank and a drying means (e.g., the tank 313 and the means 314, 315 and 316) for washing and drying the electroconductive substrate 403 after the film-forming step. Further, the apparatus shown in FIG. 4 may further include a plurality of zinc oxide film-forming tanks 401 in total so that a single rotating belt-shaped vibrating member successively passes through the tanks.

In the present invention, the electroconductive substrate may include: a metal substrate of stainless steel sheet (or plate), steel sheet, copper sheet, brass sheet and aluminum sheet and a substrate of a resin coated with a metal layer of, e.g., Al by sputtering. The above metal substrate specifically enumerated may suitably be used since these material are relatively inexpensive.

The electroconductive substrate may be used cutting it into prescribed-shaped sheets or used in a continuous shape depending on the thickness thereof. In the latter case, the electroconductive substrate can be wound up into a coil or roll, thus having a good adaptability to a continuous production process and facilitating storage and transportation.

It is also possible to use a silicon crystal substrate, glass sheet, ceramic sheet or resinous sheet as the electroconductive substrate depending on the uses.

The electroconductive substrate used in the present invention may be surface-polished. When the electroconductive substrate used has a well finished surface (e.g., a stainless steel subjected to bright annealing), the electroconductive substrate may be used as it is. Further, in order to provide an overlying zinc oxide layer with a desired unevenness (surface roughness), the electroconductive substrate may be roughened appropriately.

Figure 7:
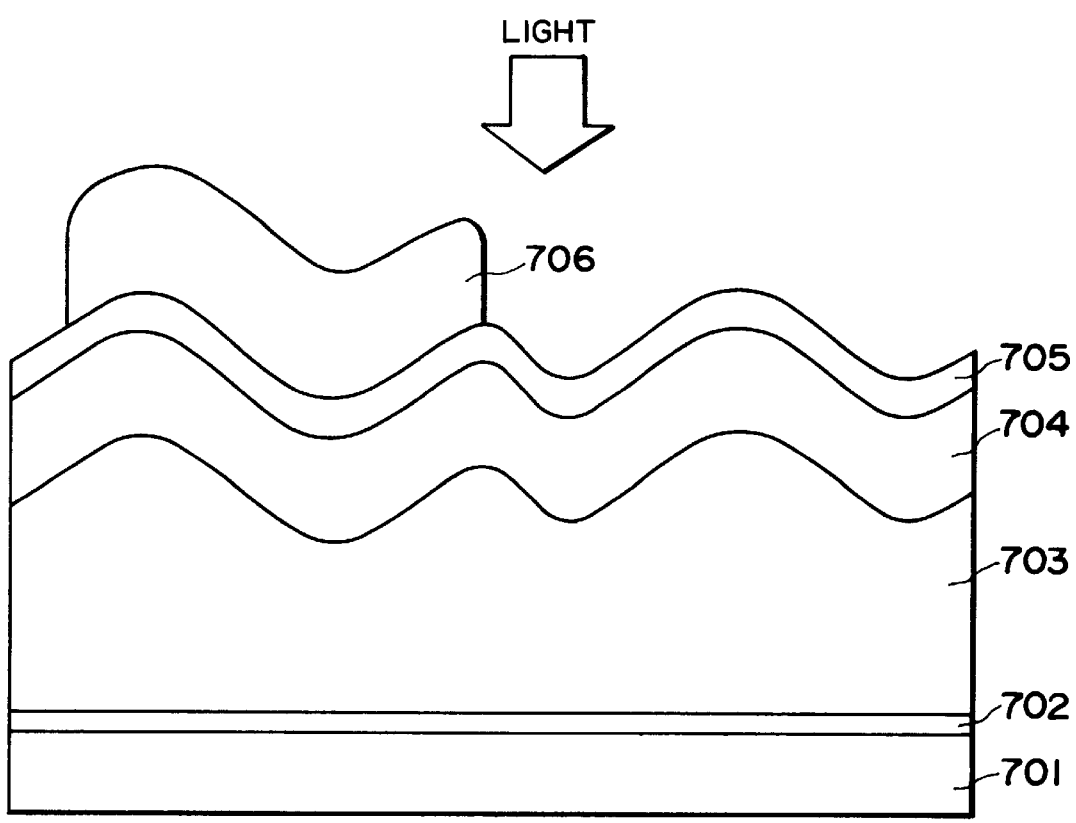
FIG. 7 is a schematic sectional view of an embodiment of a photo-electricity generating device using a zinc oxide film formed through the process according to the present invention.

FIG. 7 shows an embodiment of a photo-electricity generating device including the zinc oxide film formed by the process according to the present invention.

Referring to FIG. 7, the photo-electricity generating device includes a support 701, a metal layer 702, a zinc oxide layer 703 (formed by the above-mentioned process), a semiconductor layer 704, a transparent electroconductive layer (transparent electrode) 705, and a collector (grid) electrode 706.

The zinc oxide layer 703 may be formed in a laminate form comprising plural zinc oxide layers different in a particle size of zinc oxide crystal and an orientation (alignment) characteristic of crystallographic axis.

When an unevenness given by at least one structural members (support 701, metal layer 702, zinc oxide layer 703, and semiconductor layer 704) is sufficient to change an optical path of incident light, the charge in the optical path leas to a larger optical distance of incident light passing through the semiconductor layer 703, so that a larger absorption thereof is expected. The increase in light absorption resulting from the large optical distance in very small in an almost transparent layer with respect to incident light but becomes expontential in a region where a certain light absorption is observed, i.e., where a wavelength of incident light is a wavelength in the vicinity of the edge of the absorption band of a substrate (absorber). The zinc oxide layer 703 being a transparent layer is transparent with respect to light ranging from visible light range to near infrared light range, so that light with a wavelength ranging from 600 nm to 1200 nm is absorbed in the semiconductor layer 704.

The metal layer 702 is not necessarily used for constituting the photo-electricity generating device but may preferably be used in the case of employing a support 701 consisting of a low-reflectance material, such as stainless steel or steel or consisting of a low-conductivity material, such as glass or ceramics. In this instance, a metal layer 702 of a high-reflectance material (such as Ag, Cu, Au or Al) may preferably be formed on the support 701. Further, when the Al layer is formed on the support 701, the Al layer may be coated with a thin transparent electroconductive layer in order to prevent dissolution of Al in the above-described aqueous solution.

The semiconductor layer 704 may be of pn junction-type, pin junction-type, Shottky junction-type and heterojunction-type. Examples of a material for the semiconductor layer 704 may include amorphous silicon hydride, amorphous silicon germanium hydride, amorphous silicon carbide, microcrystalline silicon and polycrystalline silicon.

Particularly, amorphous or microcrystalline Si, C, Ge or alloys thereof may suitable be used as the material for the semiconductor layer 704 formed on the zinc oxide layer 703 when the continuous support 701 is used. THese materials may also preferably contain hydrogen and/or halogen in an amount of 0.1–40 atomic %, and may further include oxygen atom and/or nitrogen atom at a concentration of at most $5 \times 10^{19}$ cm$^{-3}$.

Further, in order to provide a p-type semiconductor layer 704 and an n-type semiconductor layer 704, Group III elements and Group V elements may be added in the semiconductor layers 704, respectively.

When the photo-electricity generating device has a stacked cell structure comprising plural semiconductor layers each including pin junction, an i-type constituting layer of the pin junction-type semiconductor layer closer to the side through which incident light passes may preferably have a broader band gap and a constituent layer may preferably have a narrower band gap with an increasing distance from the incident side of light. Further, within the respective i-type layer, a portion closer to the adjacent p-type layer may preferably have a minimum of the band gap compared with a central portion.

The doping layer on the incident side of light may preferably be made of a crystalline semiconductor showing less light absorption or a semiconductor having a broader band gap.

The semiconductor layer 704 may generally be formed through processes including microwave plasma chemical vapor deposition (MW plasma CVD), very high frequency plasma chemical vapor deposition (VHF plasma CVD), radio frequency plasma chemical vapor deposition (RF plasma CVD).

Gases (principal gases) suitable for deposition of amorphous semiconductor layer of Group IV elements and alloys of Group IV elements may principally comprise: silicon-containing compounds capable of being gasified, such as $SiH_4$ and $Si_2H_6$; and germanium-containing compound capable of being gasified, such as $GeH_4$. Further, these gases may optionally comprise compounds which contain carbon, nitrogen and/or oxygen and which can be gasified.

As a dopant gas for forming a p-type layer, $B_2H_6$ and $BF_3$ may generally be used. Further, $PH_3$ and $PF_3$ may generally be used as a dopant gas for forming an n-type layer.

Particularly, when the microcrystalline semiconductor layer, the polycrystalline semiconductor layer or an semiconductor layer, such as an SiC layer, having a low light absorption property or a broader band gap is deposited on the zinc oxide layer, the semiconductor layer is formed by using an MW power or RF power providing a relatively high power value while increasing a dilution degree of the principal gas with hydrogen gas.

The transparent electrode (electroconductive layer) 705 (shown in FIG. 7) may be formed in an appropriate thickness, thus also functioning as a reflection-preventing layer.

The transparent electrode 705 may generally be formed by using a material, such as ITO (indium tin oxide), ZnO or $InO_3$, through vapor deposition, CVD, spray coating, spinner coating or dip coating.

The transparent electrode 705 may further contain a substance for changing (controlling) an electroconductivity.

The collector (grid) electrode 706 is formed for improving a charge (or current)-collection efficiency. The collector electrode 706 may generally be formed by processes including one wherein a metal electrode pattern is formed by sputtering with a mask; a printing process with an electroconductive paste or solder paste; and one wherein a metal wire is fixed by using an electroconductive paste.

The photo-electricity generating device produced by the process according to the present invention may be covered with protective layers at both sides thereof. In this case, reinforcing members, such as steel sheet or plate, may be used in combination with the protective layers.

Hereinbelow, the present invention will be described more specifically based on Examples.

EXAMPLE 1 AND COMPARATIVE EXAMPLE 1

1.2 $\mu$m-thick zinc oxide films were formed on a stainless steel substrate (50×50×0.15 mm) by using an (electrodeposition) apparatus as shown in FIG. 1 under the following electrodeposition conditions:

Counter electrode: Zn electrode (50×50×1 mm)

Current density: ca. 5 mA/cm$^2$

Electrolytic solution: Zinc nitrate aqueous solution (concentration: 0.025, 0.05, 0.075, 0.1, 0.15, 0.2, 0.3 and 0.5 mol/l)

Solution temperature: 85° C.

Ultrasonic wave: Applied (40 kHz) for Ex. 1 Not applied for Comp. Ex. 1

After the electrodeposition, each of sample plate (stainless steel substrate having thereon the zinc oxide films prepared above) was subjected to observation with a scanning electron microscope (SEM) (magnification=5000) to counting the number of anomalous growth portion (above 20 $\mu$m and 3–20 $\mu$m in maximum length or long axis length) in a region of 10×10 mm and X-ray diffraction analysis to determine a crystal plane (represented by Miller indices) providing the strongest diffraction peak.

The results are shown in Table 1.

TABLE 1

| | | Zinc nitrate concentration (mol/l) | | | | | | | |
|---|---|---|---|---|---|---|---|---|---|
| Ex. No. | Item | 0.025 | 0.05 | 0.075 | 0.1 | 0.15 | 0.2 | 0.3 | 0.5 |
| Ex. 1 (Ultrasonic wave) | Number*[1] (>20 $\mu$m) | 0 | 0 | 0 | 0 | 0 | 0 | 0 | 0 |
| | Number*[1] (3–20 $\mu$m) | 33 | 40 | 66 | 70 | 97 | 131 | 220 | 466 |
| | Miller indices*[2] | <002> | <002> | <101> | <101> | <101> | <101> | <101> | <101> |
| Comp. Ex. 1 | Number*[1] (>20 $\mu$m) | 2 | 5 | 13 | 15 | 18 | 20 | 30 | 82 |
| | Number*[1] (3–20 $\mu$m) | 60 | 112 | 132 | 140 | 199 | 253 | 450 | 726 |
| | Miller indices*[2] | <002> | <002> | <101> | <101> | <101> | <101> | <101> | <101> |

*[1]"Number" represents the number of anomalous growth portions (above 20 $\mu$m or 3–20 $\mu$m) in a region (10 × 10 mm).
*[2]"<002>" represents a crystal plane providing the strongest diffraction peak in an associated X-ray diffraction pattern (c (crystallographic)-axis orientation or alignment).

"<101>" represents a crystal plane providing the strongest diffraction peak in an associated X-ray diffraction pattern (orientation deviated from c-axis orientation).

As apparent from Table 1, (1) it is possible to decrease the number of anomalous growth portions by applying the ultrasonic wave (ultrasonic vibration), (2) the anomalous growth portions above 20 $\mu$m are eliminated by using the ultrasonic wave, and (3) the c-axis orientation is broken or disordered at the zinc nitrate concentration of 0.075 mol/l (or above) irrespective of the ultrasonic wave application when the current density is set to ca. 5 mA/cm$^2$.

EXAMPLE 2

Zinc oxide films were formed and subjected to SEM observation in the same manner as in Example 1 except that the zinc nitrate concentrations (0.025–0.5 mol/l) were fixed at 0.2 mol/l and the frequency (40 kHz) of the ultrasonic wave was changed to 10–130 kHz (as shown in Table 2 appearing below).

The results are shown in Table 2.

TABLE 2

| Frequency (kHz) | Number (>20 μm) | Number (3–20 μm) |
| --- | --- | --- |
| 10 | 0 | 180 |
| 20 | 0 | 145 |
| 30 | 0 | 132 |
| 40 | 0 | 131 |
| 50 | 0 | 133 |
| 60 | 0 | 152 |
| 70 | 0 | 146 |
| 80 | 0 | 142 |
| 90 | 0 | 140 |
| 100 | 0 | 135 |
| 110 | 6 | 182 |
| 120 | 12 | 198 |
| 130 | 11 | 192 |

As shown in Table 2, the number of anomalous growth portions is found to be decreased particularly in the ultrasonic frequency range of 20–100 kHz.

The above-prepared sample plates and those prepared in Comparative Example 1 were subjected to a peeling test by folding or bending.

As a result, with respect to the sample plates of Comp. Example 1, peeling was initiated at the bending portion and the zinc oxide films formed at the zinc nitrate concentration of 0.075 mol/l or above were peeled off by bending back operation.

On the other hand, with respect to the sample plates of this example (Example 2), those prepared by using the ultrasonic frequencies 20–100 kHz did not cause the peeling phenomenon even at a bending angle of 180 degrees. The remaining sample plates prepared by using the ultrasonic frequencies of 10 kHz, 110 kHz, 120 kHz and 130 kHz also did not cause the peeling phenomenon at the bending angle of 180 degrees but caused cracks in a length of ca. 1 mm.

According to this example, good adhesive properties of the zinc oxide films with the stainless steel substrates were confirmed with respect to the sample plates prepared by using the ultrasonic wave. Further, in the ultrasonic frequency range of 20–100 kHz, the adhesive properties were found to be further improved.

EXAMPLE 3

Zinc oxide films were formed and subjected to the X-ray diffraction analysis in the same manner as in Example 1 except that the current density (ca. 5 mA/cm$^2$) was changed to 1.0–15 mA/cm$^2$ as shown in Table 3 (appearing below), respectively.

Figure 8:
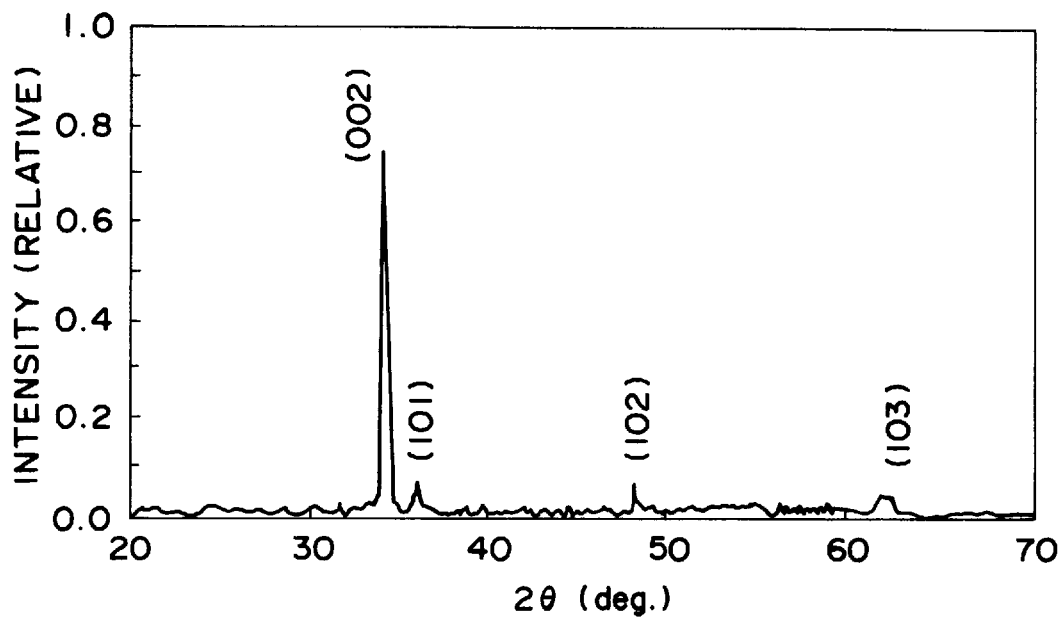
FIGS. 8 and 9 are respectively a graph showing an X-ray diffraction chart in the case of using a zinc nitrate (electrolyte) in a low concentration (FIG. 8) or a high concentration (FIG. 9).
Figure 9:
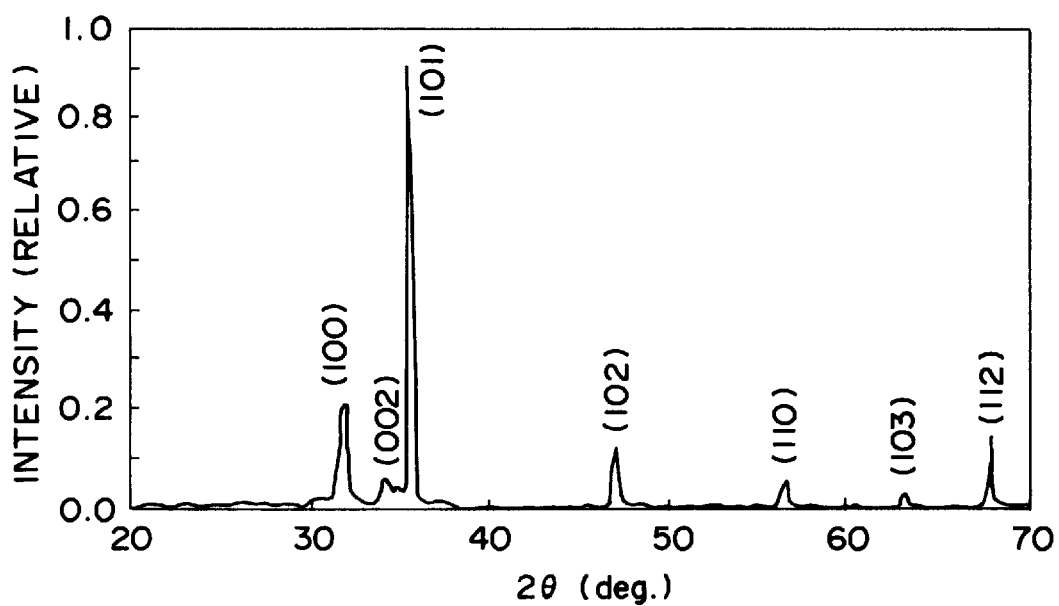

FIG. 8 showed a typical X-ray diffraction pattern providing the strongest peak at <002> plane at a low zinc nitrate concentration, and FIG. 9 showed a typical X-ray diffraction pattern providing the strongest peak at <101> plane at a high zinc nitrate concentration.

The results are shown in Table 3.

TABLE 3

| Current density (mA/cm$^2$) | Zinc nitrate concentration (mol/l) | | | | | | | |
| --- | --- | --- | --- | --- | --- | --- | --- | --- |
| | 0.025 | 0.05 | 0.075 | 0.1 | 0.15 | 0.2 | 0.3 | 0.5 |
| 1.0 | <002> | <101> | <101> | <101> | <101> | <101> | <101> | <101> |
| 2.0 | " | " | " | " | " | " | " | " |
| 5.0 | " | <002> | " | " | " | " | " | " |
| 7.0 | " | " | <002> | " | " | " | " | " |
| 10.0 | " | " | " | " | " | " | " | " |
| 15.0 | " | " | " | " | " | " | " | " |

As apparent from Table 3, the c-axis orientation of the zinc oxide crystal was found to be disordered in some cases at the zinc nitrate concentration of 0.05 mol/l or above under the ultrasonic wave application.

EXAMPLE 4

In order to confirm conditions allowing zinc oxide film formation, electrodeposition of zinc oxide was performed in the same manner as in Example 1 except that the electrodeposition conditions (zinc nitrate concentration, current density and solution temperature) were changed to those shown in Table 4 appearing below.

The results are shown in Table 4.

TABLE 4

| Solution temp (° C.) | Zinc nitrate concentration 0.025 (mol/l) Current density (mA/cm$^2$) | | | | Zinc nitrate concentration 0.075 (mol/l) Current density (mA/cm$^2$) | | | | Zinc nitrate concentration 0.2 (mol/l) Current density (mA/cm$^2$) | | | |
| --- | --- | --- | --- | --- | --- | --- | --- | --- | --- | --- | --- | --- |
| | 1.0 | 3.0 | 5.0 | 10.0 | 1.0 | 3.0 | 5.0 | 10.0 | 1.0 | 3.0 | 5.0 | 10.0 |
| 30 | No | No | No | No | No | No | No | No | No | No | No | No |
| 40 | " | " | " | " | " | " | " | " | " | " | " | " |

TABLE 4-continued

| Solution temp (° C.) | Zinc nitrate concentration 0.025 (mol/l) Current density (mA/cm$^2$) | | | | Zinc nitrate concentration 0.075 (mol/l) Current density (mA/cm$^2$) | | | | Zinc nitrate concentration 0.2 (mol/l) Current density (mA/cm$^2$) | | | |
| --- | --- | --- | --- | --- | --- | --- | --- | --- | --- | --- | --- | --- |
| | 1.0 | 3.0 | 5.0 | 10.0 | 1.0 | 3.0 | 5.0 | 10.0 | 1.0 | 3.0 | 5.0 | 10.0 |
| 50 | " | " | " | " | " | " | " | " | " | " | " | " |
| 60 | Yes | Yes | " | " | Yes | Yes | " | " | Yes | Yes | " | " |
| 70 | " | " | Yes | " | " | " | Yes | " | " | " | Yes | " |
| 80 | " | " | " | Yes | " | " | " | Yes | " | " | " | Yes |
| 90 | " | " | " | " | " | " | " | " | " | " | " | " |

Yes: Zinc oxide film was formed.
No: Zinc oxide film was not formed.

Under the ultrasonic wave application, the zinc oxide film can be formed at the solution temperature of at least 60° C., irrespective of the zinc nitrate concentration.

EXAMPLE 5 AND REFERENCE EXAMPLE 1

Zinc oxide films were formed on stainless steel substrates in the same manner as in Example 1 except that the electrodeposition conditions (the zinc nitrate concentrations and solution temperature) were changed to those shown in Table 5 appearing below and that a pre-heating treatment for 1 min. wherein the stainless steel substrates were heated at temperatures identical to the solution temperatures, respectively, was performed (for Example 5) and was not performed (for Reference Example 1) before electrodeposition.

The thus-prepared sample plates were subjected to the SEM observation in the same manner s in Example 1 to count the number of anomalous growth portions of 3–20 µm in maximum length.

The results are shown in Table 5.

TABLE 5

| Solution temperature (° C.) | (Example 5) Zinc nitrate concentration (mol/l) | | (Ref. Example 1) Zinc nitrate concentration (mol/l) | |
| --- | --- | --- | --- | --- |
| | 0.025 | 0.2 | 0.025 | 0.2 |
| 70 | 5 | 13 | 101 | 131 |
| 80 | 1 | 10 | 110 | 120 |
| 90 | 5 | 9 | 85 | 150 |

As apparent from Table 5, the pre-heating treatment was found to be very effective for decreasing the anomalous growth portions.

EXAMPLES 6–12 AND COMPARATIVE EXAMPLE 2

Photo-electricity generating devices were prepared in the following manner.

First, by using an apparatus as shown in FIG. 1, on plates each prepared by forming a 0.2 µm-thick aluminum layer on a stainless steel substrate (50×50×0.15 mm) through a sputtering process, zinc oxide films were formed by electrodeposition under the following conditions:

Counter electrode: Zn electrode (50×50×1 mm)
Current density: 10 mA/dm$^2$
Current application time: 3 min.
Electrolytic solution: Zinc nitrate aqueous solution
  (concentration: 0.025 mol/l for Examples 6–10 and Comp. Example 2; 0.2 mol/l for Examples 11 and 12) containing saccharose (concentration: 2 g/100 ml for Examples 6–11 and Comp. Example 2; 3 g/100 ml of for Example 12)
Ultrasonic wave: Applied (10–130 kHz) shown in Table 6) for Examples 6–12 Not applied for Comp. Ex. 2

The thus prepared plates having thereon the zinc oxide films were subjected to the SEM observation and X-ray diffraction analysis in the same manner as in Example 1.

With respect to Examples 6–10 and 12, based on the resultant SEM images, the zinc oxide films were found to comprise minute crystal particles of at most 0.1 µm. Further, as a result of the X-ray diffraction analysis, the strongest peak was shown at <002> plane, thus confirming the c-axis orientation.

With respect to Example 11, the zinc oxide film was found to comprise crystal particles of ca. 0.7 µm and to provide the strongest peak at <101> plane, thus confirming deviation from the c-axis orientation.

Further, anomalous growth portions above 20 µm were not observed with the SEM in the observed region of 10×10 mm for the zinc oxide films of Examples 6–12.

Then, on each of the zinc oxide films formed as described above; a 200 Å-thick n-type amorphous silicon (a-Si) layer, a 2000 Å-thick i-type amorphous silicon (a-Si) layer and a 140 Å-thick p-type microcrystalline silicon (mc-Si) layer together constituting an semiconductor layer were formed in this order by a CVD process.

On the semiconductor layer, a 650 Å-thick ITO film was formed by vapor deposition under heating and oxygen atmosphere to provide an upper electrode (transparent conductive film) having a reflection-preventing effect.

Thereafter, on the ITO film, a grid (collector) electrode of Ag was formed by vapor deposition under heating, thus preparing a photo-electricity generating device.

The thus prepared photo-electricity generating devices were subjected to measurement of a short circuit-current density and measurement of photoelectric conversion efficiencies at an initial stage and after a deterioration test under high-temperature and high-humidity environment in the following manner.

(Measurement of short circuit-current density)

The short circuit current density was determined based on a current (I)—voltage (V) characteristic of the sample device.

(Measurement of photoelectric conversion efficiency)

The photoelectric conversion efficiency was measured at 25° C. (surface temperature) by using a solar simulator (air mass (AM)=1.5; light (luminous) intensity=100 mW/cm$^2$) at an initial stage and after the photo-electricity generating device was left standing for 100 hours under application of a reverse voltage of 0.8 volt and a high temperature (85° C.)

and high-humidity (85% RH) environment. Based on these values, a lowering (%) in photoelectric conversion efficiency was determined by the following equation:

Lowering (%)=100−100×(Efficiency (%) after 100 Hr)/(Initial efficiency (%))

Evaluation of the short circuit-current density and the initial conversion efficiency were performed as a relative comparison by taking those of the photo-electricity generating device prepared in Comp. Example 2 as "1".

The results are shown in Table 6.

TABLE 6

| Ex. No. | Frequency (kHz) | Short circuit current density | Initial efficiency | Lowering (%) |
| --- | --- | --- | --- | --- |
| 6 | 10 | 1.00 | 1.01 | 10 |
| 7 | 40 | 1.00 | 1.01 | 3 |
| 8 | 70 | 1.00 | 1.01 | 4 |
| 9 | 100 | 1.00 | 1.01 | 4 |
| 10 | 130 | 1.00 | 1.00 | 11 |
| 11 | 40 | 1.10 | 1.08 | 3 |
| 12 | 40 | 1.11 | 1.09 | 1 |
| Comp. Ex. 2 | — | 1 | 1 | 52 |

The lowering in the conversion efficiency in Comp. Example 2 is very large (52%). This may be attributable to a peeling phenomenon resulting from many anomalous growth portions thereby to lower adhesive properties between the zinc oxide film and the semiconductor layer, so that a resistance is increased to lower the conversion efficiency.

EXAMPLES 13–15 AND COMPARATIVE EXAMPLE 3

Zinc oxide films were formed on a continuous stainless steel sheet (width=30 cm, length=300 m, thickness=0.12 mm) by using an apparatus as shown in FIG. 3, and were used for preparing photo-electricity generating devices in the following manner.

Referring to FIG. 3, between the lead-on roller 302 and the warm water tank 305, six tanks including a degreasing tank, a water washing (cleaning) tank, an etching tank, a water washing tank, a metal layer-forming tank and a water washing tank were disposed (not shown). In the respective tanks, conveyance rollers 304 for controlling a conveyance passage of a rolled (coiled) sheet (the continuous stainless steel sheet) 301 (hereinafter, referred to as "support sheet"). The conveyance speed (process speed) of the support sheet 301 was set to 200 cm/min. A tension of the support sheet was controlled so as to keep a value of 50 kgf by a tension-adjusting clutch incorporated in the take-up (wind-up) roller 303.

First, the support sheet 301 preliminarily coated with an anti-corrosive oil was degreased in the degreasing tank to remove the oil component. The degrease of the oil component was performed at room temperature in an aqueous solution comprising 1 liter of water, 60 ml of sulfuric acid and 70 ml of 37%-hydrochloric acid (aqueous solution).

The support sheet 301 was conveyed by the conveyance rollers to the water washing tank, where the support sheet 301 was sufficiently washed by water shower. At this time, water for the water shower may preferably be supplied at a flow rate of 21 liter/min.

Then, the support sheet 301 was conveyed by the conveyance rollers to the etching tank, where the sheet was etched at room temperature with an acid etchant comprising a mixture of 46%-hydrofluoric acid (aqueous solution)/acetic acid (1/1 by mol).

The support sheet 301 was then conveyed to the water washing tank (similar to the above-mentioned water washing tank) to be washed with water by water shower. In this instance, the water may be weak alkaline water since the subsequent metal layer-forming tank employs an alkaline aqueous solution.

Thereafter, the support sheet 301 was conveyed by the conveyance rollers to the metal layer-forming tank, where a 4000 Å-thick metal (copper) layer was formed on the support sheet 301 by electroplating under the following conditions:

Electrolytic solution: A mixture aqueous solution of 1 liter of water, 80 g of copper pyrophosphate, 300 g of potassium pyrophosphate, 6 ml of ammonia water (specific gravity=0.88), and 10 g of potassium nitrate Solution temperature: 50–60° C.

Solution pH: 8.2–8.8

Current density: 3 A/dm$^2$

Film-forming rate: 60 Å/sec.

Counter electrode: Cu sheet (anode)

The film formation was controlled by monitoring and adjusting a current value at the Cu sheet (anode) since the support sheet 301 was kept at ground potential.

After the thus treated support sheet 301 (coated with the metal layer) was then washed in the water washing tank, the support sheet 301 was conveyed by the conveyance rollers 304 to the warm water tank 305, where the support sheet 301 was sufficiently pre-heated in pure water kept at 85° C., followed by conveyance to two zinc oxide layer-forming tank 308 (each having a size: 0.5 m (width)×ca. 2 m (length)×0.5 m (height)) connected with each other by pipes.

The zinc oxide layer-forming tanks 308 contained an aqueous (electrolytic) solution comprising 30 g of zinc nitrate hydrate ($Zn(NO_3)_2 \cdot 6H_2O$) and 20 g of saccharose in 1 liter of water (for Examples 13 and 15 and Comp. Example 3) or 20 g of zinc nitrate hydrate and 0.02 g of dextrin in 1 liter of water (for Example 14).

The support sheet 301 immersed in the aqueous solution kept at 85° C. and pH=5.9–6.4 was subjected to electrodeposition under the following conditions to form thereon a 1 µm-thick zinc oxide layer (film).

Counter electrode 310: Zn sheet (ca.30×ca.30 cm) (surface-buffed)

Current density: 5 A/dm$^2$

Film-forming rate: 30 Å/sec

Ultrasonic wave: Applied (40 kHz) by ultrasonic oscillator 307 (15×15 cm)

Thereafter, the thus treated support sheet 301 was conveyed by the conveyance roller 304 to the water washing tank in which the sheet 301 was washed with water, followed by conveyance to the drying means 315 provided with warm air-supplying nozzles (not shown) the infrared heaters 316 by using the conveyance rollers 304. The arm air from the nozzles was kept at 80° C. and supplied to the support sheet 301 for drying the sheet, thus removing the water remaining on the sheet surface. at this time, the infrared heaters 316 were actuated at 200° C.

After drying the support sheet 301, the sheet 301 having thereon the metal layer and the zinc oxide layer in this order was wound up (coiled) by the wind-up roller 303.

Incidentally, the aqueous solution in the metal layer-forming tank was stirred or circulated by bubbling and that in the zinc oxide film-forming tank was stirred by ultrasonic wave (ultrasonic vibration). Further, pH values of the solutions in the metal layer-forming tank and the zinc oxide film-forming tank were respectively monitored by a pH meter including a glass electrode and a temperature-correction mechanism, an were adjusted by supplementing an appropriate amount of ammonia water (for the metal layer-forming tank) or zinc nitrate (for the zinc oxide film-forming tank).

On the thus prepared zinc oxide film (layer) of the support sheet, a semiconductor layer comprising a pin junction-type triple cell structure including 9 layers was formed by a CVD process. The cell structure was formed on the zinc oxide film in 9 layers in the following order: 20 nm-thick 1st n-type a-Si layer/110 nm-thick 1st i-type a-SiGe layer/10 nm-thick p-type mc-Si layer/10 nm-thick 2nd n-type a-Si layer/110 nm-thick 2nd i-type a-SiGe layer/10 nm-thick p-type mc-Si layer/10 nm-thick 3rd n-type a-Si layer/100 nm-thick 3rd i-type a-Si layer/10 nm-thick p-type mc-Si layer.

Further, on the semiconductor layer, a 60 nm-thick ITO film was formed by sputtering, and therefore, a collector (grid) electrode of Ag paste was formed to prepare a photo-electricity generating device for Example 15 was prepared in the same manner as in Example 13 except that a 4000 Å-thick Cu layer was formed by using a DC magnetron sputtering process.

Further, a photo-electricity generating device for Comp. Example 3 was prepared in the same manner as in Example 13 except that the ultrasonic wave was not used for forming the zinc oxide layer.

The thus prepared photo-electricity generating devices were evaluated in the same manner as in Examples 6–12 and Comp. Example 2 while taking values of Comp. Example 3 as basis of comparison ("1").

The results are shown in Table 7.

TABLE 7

| Ex. No. | Short circuit current density (mA/cm$^2$) | Initial efficiency (%) | Lowering (%) |
|---------|-------------------------------------------|------------------------|--------------|
| 13      | 1.01                                      | 1.01                   | 2            |
| 14      | 0.99                                      | 1.00                   | 2            |
| 15      | 1.03                                      | 1.02                   | 2            |
| Comp. Ex. 2 | 1                                     | 1                      | 47           |

EXAMPLE 16 AND COMPARATIVE EXAMPLE 4

By using an apparatus shown in FIG. 2, 20 zinc oxide films were each formed on a stainless steel substrate (50× 50×0.15 mm) under ultrasonic vibration application and electrodeposition conditions including equally varying zinc nitrate concentrations shown in Table 8 (appearing hereinafter) (for Example 16).

Similarly, 20 zinc oxide films were formed in the same manner as in Example 16 except that ultrasonic vibration was not applied (for Comp. Example 4).

EXAMPLE 17 AND COMPARATIVE EXAMPLE 5

By using an apparatus shown in FIG. 4, 20 zinc oxide films were each formed on a continuous stainless steel sheet (30 cm×300 m×0.12 mm) under ultrasonic vibration application and electrodeposition conditions including equally varying zinc nitrate concentrations shown in Table 8 (appearing hereinafter) (for Example 17).

Similarly, 20 zinc oxide films were formed in the same manner as in Example 17 except that ultrasonic vibration was not applied (for Comp. Example 5).

EXAMPLE 18, COMPARATIVE EXAMPLE 6 AND REFERENCE EXAMPLE 2

By using an apparatus shown in FIG. 4, 20 zinc oxide films were each formed on a continuous stainless steel sheet (width=30 cm, length=300 m, thickness=0,12 mm) under ultrasonic vibration application and electrodeposition conditions including equally varying zinc nitrate concentrations shown in Table 8 (for Example 18). In this example, a counter magnet 603 was disposed opposite to a magnetic rotating belt-shaped vibrating member 601 as shown in FIG. 6B, and a water washing tank (not shown) was disposed for washing the sheet after the zinc oxide film formation. Further, perpendicular vibration (to the sheet) was applied by using an ultrasonic oscillator (not shown).

Similarly, 20 zinc oxide films were formed in the same manner as in Example 18 except that ultrasonic vibration was not applied (for Comp. Example 6).

Further, in order to confirm the effect of the counter magnet 603, 20 zinc oxide films were formed in the same manner as in Example 18 except that the counter magnet 603 was not used (for Ref. Example 2).

EXAMPLE 19 AND COMPARATIVE EXAMPLE 7

Figure 10:
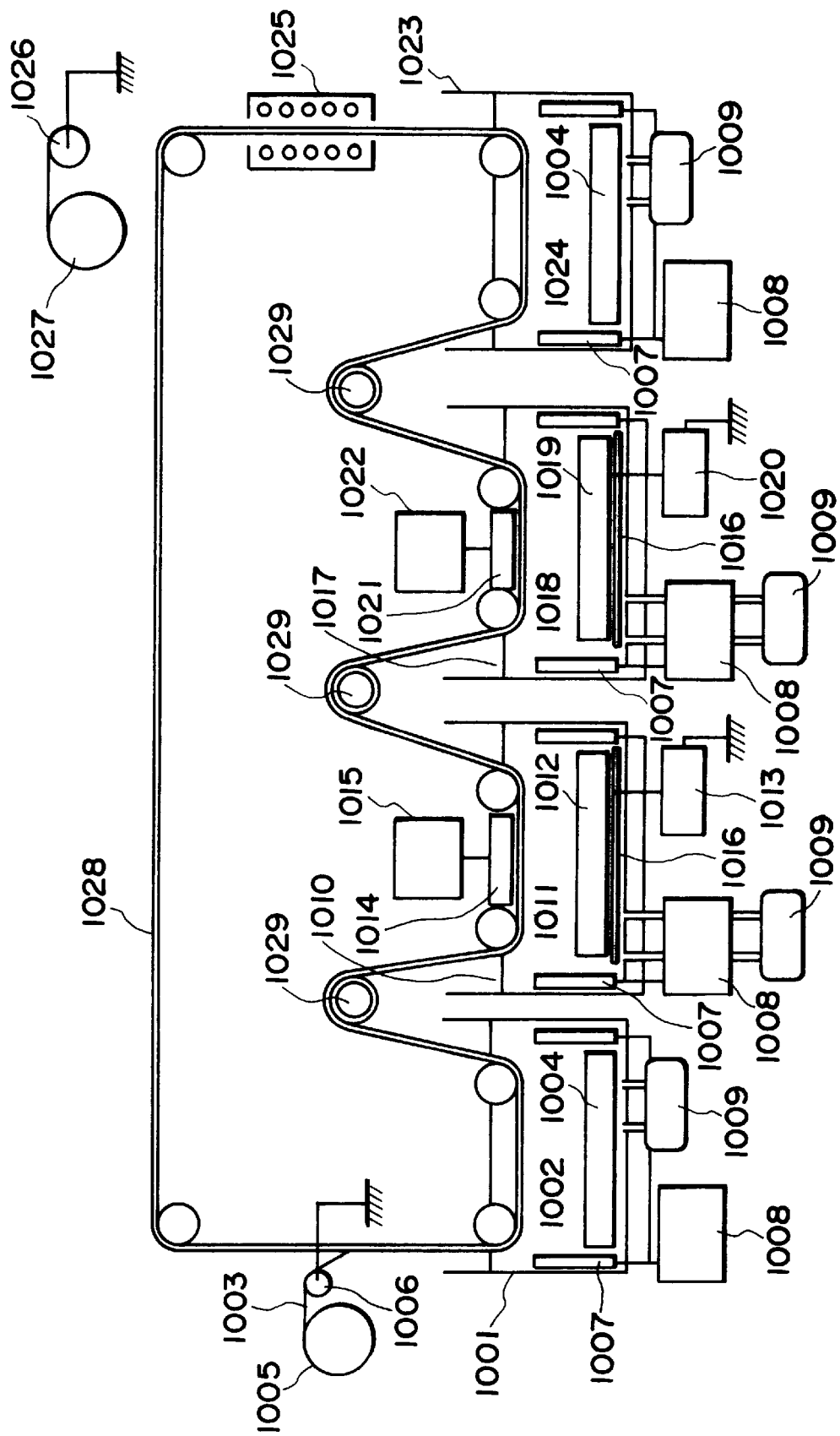
FIG. 10 is a schematic sectional view showing an embodiment of a continuous forming apparatus for a zinc oxide film of a two layer-type.

By using an apparatus shown in FIG. 10, 20 zinc oxide films were each formed on a continuous stainless steel sheet (30 cm×300 m×0.12 mm) under ultrasonic vibration application and electrodeposition conditions including equally varying zinc nitrate concentrations shown in Table 8 (for Example 19).

Similarly, 20 zinc oxide films were formed in the same manner as in Example 19 except that ultrasonic vibration was not applied (for Comp. Example 7).

The apparatus shown in FIG. 10 included four tanks including a cleaning (washing) tank 1001, a first zinc oxide film-forming tank 1010, a second zinc oxide film-forming tank 1017 and a cleaning tank 1023.

In the cleaning tanks 1001 and 1023, ultrasonic vibrating members 1004 were disposed, respectively, thus allowing effective cleaning of the sheet.

As shown in FIG. 10, the apparatus were constituted by structural members (or means) including: the cleaning tanks 1001 and 1023; the first and second zinc oxide film-forming tanks 1010 and 1017; washing solutions 1002 and 1024; zinc nitrate aqueous solutions 1011 and 1018; the ultrasonic vibrating members 1004; counter Zn electrodes 1012 and 1019; counter magnets 1016; heaters 1007; heater power supplies 1008; power supplies 1013 and 1020 (for the Zn electrodes); circulating pumps 1009; vibrating members 1014 and 1021; vibration power supply 1015 and 1022; lead-on roller 1005; the continuous stainless steels heat 1003; electrode rollers 1006 and 1026 wind-up roller 1027; edge supporting rollers 1029; magnetic rotating belt 1028; and drying means 1025.

EXAMPLE 20 AND REFERENCE EXAMPLE 3

By using an apparatus shown in FIG. 4, 20 zinc oxide films were each formed on a continuous stainless steel sheet (width=30 cm, length=300 m, thickness=0.12 mm) under ultrasonic vibration application and electrodeposition conditions including equally varying solution temperature shown in Table 8 (for Example 18). In this example, a counter magnet 603 was disposed opposite to a magnetic rotating belt-shaped vibrating member 601 as shown in FIG. 6B.

Of the above-prepared 20 zinc oxide films, those formed at the solution temperatures 25–50° C. were used for Ref. Example 3.

EXAMPLE 21 AND REFERENCE EXAMPLE 4

By using an apparatus shown in FIG. 4, 20 zinc oxide films were each formed on a continuous stainless steel sheet (width=30 cm, length=300 m, thickness=0.12 mm) under ultrasonic vibration application and electrodeposition conditions including equally varying zinc nitrate concentrations shown in Table 8 (for Example 21). In this example, a counter magnet 603 was disposed opposite to a magnetic rotating belt-shaped vibrating member 601 as shown in FIG. 6B, and a water washing tank (not shown) was disposed for washing the sheet after the zinc oxide film formation. Further, the continuous sheet was preliminarily coated with a 2000 Å-thick Ag layer by sputtering.

Of the above-formed 20 zinc oxide films, those formed at the zinc nitrate concentrations of 0.0005–0.001 mol/l were used for Ref. Example 4.

EXAMPLE 22 AND REFERENCE EXAMPLES 5 AND 6

By using an apparatus shown in FIG. 4, 20 zinc oxide films were each formed on a continuous stainless steel sheet (width=30 cm, length=300 m, thickness=0.12 mm) under ultrasonic vibration application and electrodeposition conditions including equally varying current densities shown in Table 8 (for Example 22). In this example, a counter magnet 603 was disposed opposite to a magnetic rotating belt-shaped vibrating member 601 as shown in FIG. 6B, and a water washing tank (not shown) was disposed for washing the sheet after the zinc oxide film formation. Further, the continuous sheet was preliminarily coated with a 2000 Å-thick Ag layer by sputtering.

Of the above-formed 20 zinc oxide films, those formed at the current densities of 7 mA/dm$^2$ and 12 mA/dm$^2$ were used for Ref. Examples 5 and 6, respectively.

EXAMPLE 23 AND REFERENCE EXAMPLES 7 AND 8

By using an apparatus shown in FIG. 4, 20 zinc oxide films were each formed on a continuous stainless steel sheet (width=30 cm, length=300 m, thickness=0.12 mm) under ultrasonic vibration application and electrodeposition conditions shown in Table 8 (for Example 23). In this example, a counter magnet 603 was disposed opposite to a magnetic rotating belt-shaped vibrating member 601 as shown in FIG. 6B, and a water washing tank (not shown) was disposed for washing the sheet at varying temperatures of 20–95° C. before the zinc oxide film formation. Further, the continuous sheet was preliminarily coated with a 2000 Å-thick Ag layer by sputtering.

Of the above-formed 20 zinc oxide films, those formed at the water solution temperatures of 23° C. and 95° C. were used for Ref. Examples 7 and 8, respectively.

EXAMPLE 24 AND COMPARATIVE EXAMPLE 8

By using an apparatus shown in FIG. 4, 20 zinc oxide films were each formed on a continuous stainless steel sheet (width=30 cm, length=300 m, thickness=0.12 mm) under ultrasonic vibration application and electrodeposition conditions including equally varying zinc nitrate solution temperatures shown in Table 8 (for Example 24). In this example, a counter magnet 603 was disposed opposite to a magnetic rotating belt-shaped vibrating member 601 as shown in FIG. 6B, and the continuous sheet was preliminarily coated with a 2000 Å-thick Ag layer before the zinc oxide film formation.

Similarly, 20 zinc oxide films were formed in the same manner as in Example 24 except that ultrasonic vibration was not applied (for Comp. Example 8).

TABLE 8

| Ex. No. | 16 | 17 | 18 | 19 | 20 | 21 | 22 | 23 | 24 |
| --- | --- | --- | --- | --- | --- | --- | --- | --- | --- |
| Zinc nitrate (mol/l) | 0.05–0.2 | 0.05–0.2 | 0.1–0.2 | 0.025–0.05 | 0.15 | 0.0005–2.0 | 0.3 | 0.1 | 0.1–0.2 |
| Saccharose (g/l) | 100 | 70 | — | 1st: 50*$^1$ 2nd: 80*$^2$ | — | 150 | 100 | 70 | 10–70 |
| Dextrin (g/l) | — | — | 0.1 | — | — | — | — | — | — |
| Gulocose (g/l) | — | — | — | — | 200 | — | — | — | — |
| Current density (mA/cm$^2$) | 1000 | 10000 | 5000 | 1st: 3000 2nd: 100 | 500 | 500 | 10–10000 | 5000 | 0.5–5000 |
| Electrolytic solution temp. (° C.) | 80 | 75 | 85 | 1st: 75 2nd: 85 | 25–95 | 85 | 85 | 85 (20–95)*$^3$ | 60–85 |
| Conveyance speed (mm/min.) | — | 1000 | 1500 | 1500 | 1500 | 1500 | 1200 | 1500 | 1900 |
| Perpendicular amplitude (mm) | 0.5–10 | 0.5–100 | 0.0015–0.0025 | 15–25 | 20 | 50 | 50 | 15–25 | 15–25 |
| Perpendicular frequency (kHz) | 10 | 1–100 | 40 | 50 | 100 | 100 | 100 | 50 | 50–100 |
| Parallel amplitude (mm) | 5–10 | 0.5–100 | 5–10 | 5–10 | 10 | 20 | 20 | 5–10 | 5–10 |
| Parallel frequency (kHz) | 100 | 1–100 | 50 | 40 | 50 | 100 | 100 | 50 | 50–100 |

TABLE 8-continued

| Ex. No. | 16 | 17 | 18 | 19 | 20 | 21 | 22 | 23 | 24 |
|---|---|---|---|---|---|---|---|---|---|
| ZnO thickness (μm) | 2.0 | 1.0 | 1.0 | 1.8 | 1.0 | 1.0 | 1.0 | 1.0 | 1.0 |

*1: "1st" was concerned with the associate condition in the first zinc oxide film forming tank.
*2: "2nd" was concerned with the associate condition in the second zinc oxide film forming tank.
*3: These temperatures were varying water temperatures in the water mashing tank for washing the sheet before the zinc oxide film formation.

*1: "1st" was concerned with the associate condition in the first zinc oxide film forming tank.

*2: "2nd" was concerned with the associate condition in the second zinc oxide film forming tank.

*3: These temperatures were varying water temperatures in the water mashing tank for washing the sheet before the zinc oxide film formation.

The zinc oxide films thus formed on the stainless steel sheets or substrates (for Examples 16–24, Comp. Examples 4–8 and Ref. Examples 2–8) were evaluated in the following manners, respectively.

<Anomalous growth>

The number of anomalous growth portions of at least 10 μm in maximum length were counted by using an optical microscope (magnification=5000) in a region of 1×1 cm at a central portion of each zinc oxide film.

<Crystal particle size (distribution)>

The zinc oxide crystal was observed through an SEM (magnification=5000) to measure an average particle size of the crystal (wurtizte-type) within a region of 5×5 μm. Further, based on measured values in a region of 20×20 μm, a fluctuation in the particle size was evaluated.

<Adhesive properties>

Initial adhesive properties were evaluated as follows.

A part of the zinc oxide film was cut or scribed by a cutting means so that 11 parallel lines intersected with other 11 parallel lines at right angles to constitute 100 square regions (each size=1×1 mm).

A cellophane (adhesive) tape was intimately applied onto the square regions of the zinc oxide film and was instantaneously peeled off therefrom to count the number of the peeled regions to determine an peeled area (mm²) thereof.

Adhesive properties after a deterioration test were evaluated in the same manner as in the initial adhesive properties after the sheet (having thereon the zinc oxide film) was left standing for 100 hours under a high-temperature (85° C.) and high-humidity (85% RH) environment.

With respect to the anomalous growth phenomenon, substantially no or less (0–10) anomalous growth portions were observed in the zinc oxide films for Examples 16–24 but at least 100 anomalous growth portions were observed in the zinc oxide films for Comp. Examples 4–8 and Ref. Examples 2–8.

Other evaluation results are shown in Table 9 appearing hereinbelow, wherein respective values are relative values obtained by taking those for the indicated Comp. Examples or Ref. Examples as "1" (basis of comparison).

By using the above-prepared stainless steel sheets (substrates) each having thereon the zinc oxide film(s) (for Examples 16–24, Comp. Examples 4–8 and Ref. Examples 1–8), photo-electricity generating devices as shown in FIG. 7 were produced in the same manner as in Examples 6–12 (and Comp. Example 2).

Each of the photo-electricity generating devices thus prepared was separated or cut into 25 sample devices, which were subjected to measurement of a shunt resistance in a dark place under application of a reverse bias voltage of −1.0 V, thus evaluating yields while taking a shunt resistance of $4\times10^4$ ohm.cm² as a reference value. The yield was evaluated as the number of the sample devices showing a shunt resistance of at least $4\times10^4$ ohm.cm².

Further, initial adhesive properties of each photo-electricity generating device were evaluated in the same manner as in those for the case of the zinc oxide film described above. The adhesive properties of the device were evaluated as the number of non-peeled regions.

Each photo-electricity generating device was also subjected to measurement of photoelectric conversion efficiencies of an initial stage and after a deterioration test in the same manner as in Examples 6–12 (and Comp. Example 2).

The results are shown in Table 9, wherein respective values are relative values obtained by taking those for the indicated Comp. Examples or Ref. Examples as "1" (basis of comparison).

TABLE 9

| | Ex. No. | | | | | | | | | | |
|---|---|---|---|---|---|---|---|---|---|---|---|
| | 16 | 17 | 18 | 19 | 20 | 21 | 22 | Ref. Ex. 6 | 23 | Ref. Ex. 7 | 24 |
| | | | | | Comparison basis | | | | | | |
| | Comp. Ex. 4 | Comp. Ex. 5 | Comp. Ex. 6 | Comp. Ex. 7 | Ref. Ex. 3 | Ref. Ex. 4 | Ref. Ex. 5 | Ref. Ex. 5 | Ref. Ex. 8 | Ref. Ex. 8 | Ref. Ex. 8 |
| Particle size fluctuation | 0.67 | 0.83 | 0.91 | 0.83 | 0.77 | 0.71 | 0.74 | 0.72 | 0.71 | 0.70 | 0.91 |
| Particle size | 1.77 | 1.20 | 1.22 | 1.25 | 1.77 | 1.05 | 1.11 | 1.10 | 1.14 | 1.10 | 1.09 |
| Peeling area (initial) | 0.83 | 0.91 | 0.91 | 0.83 | 0.83 | 0.77 | 0.74 | 0.72 | 0.77 | 0.73 | 0.91 |
| Peeling area (after 100 hr) | 0.77 | 0.83 | 0.87 | 0.80 | 0.80 | 0.77 | 0.71 | 0.70 | 0.83 | 0.80 | 0.87 |

TABLE 9-continued

| | Ex. No. | | | | | | | | | |
|---|---|---|---|---|---|---|---|---|---|---|
| | 16 | 17 | 18 | 19 | 20 | 21 | 22 | Ref. Ex. 6 | 23 | Ref. Ex. 7 | 24 |
| | | | | | Comparison basis | | | | | | |
| | Comp. Ex. 4 | Comp. Ex. 5 | Comp. Ex. 6 | Comp. Ex. 7 | Ref. Ex. 3 | Ref. Ex. 4 | Ref. Ex. 5 | Ref. Ex. 5 | Ref. Ex. 8 | Ref. Ex. 8 | Ref. Ex. 8 |
| Yield | 1.5 | 1.3 | 1.2 | 1.4 | 1.3 | 1.4 | 1.20 | 1.25 | 1.05 | 1.10 | 1.20 |
| Adhesive properties | 1.5 | 1.4 | 1.2 | 1.3 | 1.3 | 1.35 | 1.25 | 1.30 | 1.10 | 1.14 | 1.15 |
| Efficiency (initial) | 1.3 | 1.3 | 1.3 | 1.4 | 1.35 | 1.25 | 1.30 | 1.32 | 1.05 | 1.10 | 1.25 |
| Efficiency (after 100 hr) | 1.4 | 1.3 | 1.2 | 1.3 | 1.25 | 1.30 | 1.30 | 1.34 | 1.10 | 1.10 | 1.20 |

As apparent from Table 9, the zinc oxide films and the photo-electricity generating devices prepared in Examples 16–24 and Reference Examples 6 and 7 according to the present invention provided better performances compared with those of Comparative Examples 4–8 and Reference Examples 3–8 (basis of comparison).

As described hereinabove, according to the processes of the present invention, it is possible to form a zinc oxide film by electrodeposition, thus omitting a vacuum production process to reduce a production cost thereof. Further, based on the use of ultrasonic wave, it is possible to suppress anomalous growth portions particularly above 20 μm, thus allowing a zinc oxide film formation excellent in yield, uniformity and adhesive properties.

The photo-electricity generating device produced by the process according to the present invention includes the above zinc oxide film, thus improving production yield, adhesiveness and photoelectric conversion efficiency even after the deterioration test.

What is claimed is:

1. A process for forming a zinc oxide film, comprising:
   immersing an electroconductive substrate and an electrode in an aqueous solution containing nitrate ion and zinc ion, and
   supplying a current passing through a gap between the electroconductive substrate and the electrode while vibrating the electroconductive substrate to form a zinc oxide film on the electroconductive substrate.

2. A process according to claim 1, wherein the electroconductive substrate is vibrated via the aqueous solution by using an ultrasonic oscillator.

3. A process according to claim 2, wherein the ultrasonic oscillator provides a frequency of 20–100 kHz.

4. A process according to claim 1, wherein the electroconductive substrate is vibrated by disposing a vibrating member in contact with the electroconductive substrate.

5. A process according to claim 4, wherein the vibrating member provides a frequency of 1 Hz–100 kHz.

6. A process according to claim 4, wherein the vibrating member provides an amplitude of 1 μm–100 mm.

7. A process according to claim 1, wherein the electroconductive substrate is vibrated by using the vibrating means providing different frequencies.

8. A process according to claim 1, wherein the electroconductive substrate is vibrated in a parallel direction and a perpendicular direction thereof.

9. A process according to claim 1, wherein the electroconductive substrate is in a continuous shape.

10. A process according to claim 9, wherein the electroconductive substrate is vibrated by disposing a rotating belt in intimate contact with the electroconductive substrate and also in contact with a vibrating member while moving the rotating belt and the electroconductive substrate in the same direction.

11. A process according to claim 10, wherein the rotating belt comprises a magnetic material.

12. A process according to claim 11, wherein the rotating belt comprising the magnetic material is disposed opposite to a magnetic member.

13. A process according to claim 11, wherein the rotating belt is formed by dispersing the magnetic material in a rubber selected from the group consisting of silicone rubber, fluorine-containing rubber, urethane rubber, nitrile rubber, styrene-based rubber, and butyl rubber.

14. A process according to claim 10, wherein the rotating belt has a recess portion for fitting the electroconductive substrate therein.

15. A process according to claim 1, wherein the aqueous solution has a temperature above 50° C.

16. A process according to claim 1, wherein the aqueous solution has a zinc nitrate concentration of 0.001–1.0 mol/l.

17. A process according to claim 1, wherein the current has a current density of 10 mA/dm$^2$–10 A/dm$^2$.

18. A process according to claim 1, further comprising a step of controlling a temperature of the electroconductive substrate so as to be within ±5° C. of an aqueous solution temperature before the immersion step.

19. A process according to claim 1, wherein the electroconductive substrate is formed by disposing a metal layer on a substrate.

20. A process according to claim 1, wherein the zinc oxide film comprises a first zinc oxide film and a second zinc oxide film.

21. A process according to claim 20, wherein the first and second zinc oxide films are formed under different conditions in at least one of a concentration of the aqueous solution, a current density, an aqueous solution temperature, a frequency of the vibration of the electroconductive substrate, and amplitude of the vibration of the electroconductive substrate and a direction of the vibration of the electroconductive substrate.

22. A process according to claim 1, wherein the aqueous solution comprises a carbohydrate.

23. A process according to claim 1, wherein the current is supplied such that a c-axis orientation of a crystal of the zinc oxide film is disordered.

24. A process for producing a photo-electricity generating device, comprising:
   immersing an electroconductive substrate and an electrode in an aqueous solution containing nitrate ion and zinc ion, supplying a current passing through a gap between the electroconductive substrate and the electrode while vibrating the electroconductive substrate to form a zinc oxide film on the electroconductive substrate; and forming a semiconductor layer on the zinc oxide film.

25. A process according to claim 24, wherein the electroconductive substrate is vibrated via the aqueous solution by using an ultrasonic oscillator.

26. A process according to claim 25, wherein the ultrasonic oscillator provides a frequency of 20–100 kHz.

27. A process according to claim 24, wherein the electroconductive substrate is vibrated by disposing a vibrating member in contact with the electroconductive substrate.

28. A process according to claim 27, wherein the vibrating member provides a frequency of 1 Hz–100 kHz.

29. A process according to claim 27, wherein the vibrating member provides an amplitude of 1 $\mu$m–100 mm.

30. A process according to claim 24, wherein the electroconductive substrate is vibrated by using the vibrating means providing different frequencies.

31. A process according to claim 24, wherein the electroconductive substrate is vibrated in a parallel direction and a perpendicular direction thereof.

32. A process according to claim 24, wherein the electroconductive substrate is in a continuous shape.

33. A process according to claim 32, wherein the electroconductive substrate is vibrated by disposing a rotating belt in intimate contact with the electroconductive substrate and also in contact with a vibrating member while moving the rotating belt and the electroconductive substrate in the same direction.

34. A process according to claim 33, wherein the rotating belt comprises a magnetic material.

35. A process according to claim 34, wherein the rotating belt is disposed opposite to a magnetic member.

36. A process according to claim 34, wherein the rotating belt is formed by dispersing the magnetic material in a rubber selected from the group consisting of silicone rubber, fluorine-containing rubber, urethane rubber, nitrile rubber, styrene-based rubber, and butyl rubber.

37. A process according to claim 33, wherein the rotating belt has a recess portion for fitting the electroconductive substrate therein.

38. A process according to claim 24, wherein the aqueous solution has a temperature above 50° C.

39. A process according to claim 24, wherein the aqueous solution has a zinc nitrate concentration of 0.001–1.0 mol/l.

40. A process according to claim 24, wherein the current has a current density of 10 mA/dm$^2$–10 A/dm$^2$.

41. A process according to claim 24, further comprising a step of controlling a temperature of the electroconductive substrate so as to be within ±5° C. of an aqueous solution temperature before the immersion step.

42. A process according to claim 24, wherein the electroconductive substrate is formed by disposing a metal layer on a substrate.

43. A process according to claim 24, wherein the zinc oxide film comprises a first zinc oxide film and a second zinc oxide film.

44. A process according to claim 43, wherein the first and second zinc oxide films are formed under different conditions in at least one of a concentration of the aqueous solution, a current density, an aqueous solution temperature, a frequency of the vibration of the electroconductive substrate, an amplitude of the vibration of the electroconductive substrate and a direction of the vibration of the electroconductive substrate.

45. A process according to claim 24, wherein the aqueous solution comprises a carbohydrate.

46. A process according to claim 24, wherein the semiconductor layer comprises a non-crystal silicon semiconductor.

47. A process according to claim 24, wherein the current is supplied such that a c-axis orientation of a crystal of the zinc oxide film is disordered.

48. A process for producing a plate for a semiconductor device comprising an electroconductive substrate and a zinc oxide film formed thereon; said process comprising:

immersing an electroconductive substrate and an electrode in an aqueous solution containing nitrate ion and zinc ion, and supplying a current passing through a gap between the electroconductive substrate and the electrode while vibrating the electroconductive substrate to form a zinc oxide film on the electroconductive substrate.

49. A process according to claim 48, wherein the electroconductive substrate is vibrated via the aqueous solution by using an ultrasonic oscillator.

50. A process according to claim 49, wherein the ultrasonic oscillator provides a frequency of 20–100 kHz.

51. A process according to claim 48, wherein the electroconductive substrate is vibrated by disposing a vibrating member in contact with the electroconductive substrate.

52. A process according to claim 51, wherein the vibrating member provides a frequency of 1 Hz–100 kHz.

53. A process according to claim 51, wherein the vibrating member provides an amplitude of 1 $\mu$m–100 mm.

54. A process according to claim 48, wherein the electroconductive substrate is vibrated by using the vibrating means providing different frequencies.

55. A process according to claim 48, wherein the electroconductive substrate is vibrated in a parallel direction and a perpendicular direction thereof.

56. A process according to claim 48, wherein the electroconductive substrate is in a continuous shape.

57. A process according to claim 56, wherein the electroconductive substrate is vibrated by disposing a rotating belt in intimate contact with the electroconductive substrate and also in contact with a vibrating member while moving the rotating belt and the electroconductive substrate in the same direction.

58. A process according to claim 57, wherein the rotating belt comprises a magnetic material.

59. A process according to claim 58, wherein the rotating belt is disposed opposite to a magnetic member.

60. A process according to claim 58, wherein the rotating belt is formed by dispersing the magnetic material in a rubber selected from the group consisting of silicone rubber, fluorine-containing rubber, urethane rubber, nitrile rubber, styrene-based rubber, and butyl rubber.

61. A process according to claim 57, wherein the rotating belt has a recess portion for fitting the electroconductive substrate therein.

62. A process according to claim 48, wherein the aqueous solution has a temperature above 50° C.

63. A process according to claim 48, wherein the aqueous solution has a zinc nitrate concentration of 0.001–1.0 mol/l.

64. A process according to claim 48, wherein the current has a current density of 10 mA/dm$^2$–10 A/dm$^2$.

65. A process according to claim 48, further comprising a step of controlling a temperature of the electroconductive substrate so as to be within ±5° C. of an aqueous solution temperature before the immersion step.

66. A process according to claim 48, wherein the electroconductive substrate is formed by disposing a metal layer on a substrate.

67. A process according to claim 48, wherein the zinc oxide film comprises a first zinc oxide film and a second zinc oxide film.

68. A process according to claim 67, wherein the first and second zinc oxide films are formed under different conditions in at least one of a concentration of the aqueous solution, a current density, an aqueous solution temperature, a frequency of the vibration of the electroconductive substrate, an amplitude of the vibration of the electroconductive substrate and a direction of the vibration of the electroconductive substrate.

69. A process according to claim 48, wherein the aqueous solution comprises a carbohydrate.

70. A process according to claim 48, wherein the current is supplied such that a c-axis orientation of a crystal of the zinc oxide film is disordered.

* * * * *

UNITED STATES PATENT AND TRADEMARK OFFICE
CERTIFICATE OF CORRECTION

PATENT NO. : 6,068,755
DATED : May 30, 2000
INVENTOR(S) : Koichi Matsuda et al.

It is certified that error appears in the above-identified patent and that said Letters Patent is hereby corrected as shown below:

Title page, Item [56], References Cited, Other Publications
"Masanobu Izaki et al," should read -- Izaki, Masanobu, et al., --;
"Inoue, Y., et al." should read -- Inoue, Y., et al., --;
"a-SiC/a-Sila-SiGe" should read -- a-SiC/a-Si/a-SiGe --.

References Cited, Foreign Patent Documents
"8217443" should read -- 8-217443 --.

Column 3,
Line 21, "ion," should read -- ion; --;
Line 49, "a" should read -- an --.

Column 7,
Line 4, "ay" should read -- may --;
Line 13, "an" should read -- and --.

Column 8,
Line 30, "at" (first occurrence) should read -- to be --;
Line 43, "suppressing" should read -- suppress --;
Line 46, "poly-saccharide." should read -- polysaccharide. --;
Line 61, "include" should read -- includes --.

Column 9,
Line 44, "include" should read -- includes --.

Column 10,
Line 3, "immediately" should read -- immediate --;
Line 37, "FIG.5)" should read -- FIG.5), --;
Line 53, "represent" should read -- represents --.

Column 11,
Line 62, "leas" should read -- leads --;
Line 65, "in" (first occurrence) should read -- is --.

Column 12,
Line 27, "suitable" should read -- suitably --;
Line 29, "THese" should read -- These --;
Line 57, "radio" should read -- or radio --.

UNITED STATES PATENT AND TRADEMARK OFFICE
CERTIFICATE OF CORRECTION

PATENT NO. : 6,068,755
DATED : May 30, 2000
INVENTOR(S) : Koichi Matsuda et al.

It is certified that error appears in the above-identified patent and that said Letters Patent is hereby corrected as shown below:

Column 13,
Line 67, "5 mA/cm$^2$" should read -- 5mA/cm$^2$ --.

Column 14,
Line 11, "(SEM)" should read -- (SEM) --.

Column 16,
Line 3, "20-100 kHz" should read -- 20-100kHz --.

Column 17,
Line 26, "1 min." should read -- 1 min., --.

Column 18,
Line 21, "6)" should read -- 6 --;

Column 20,
Line 34, "tank" should read -- tanks --;
Line 61, "at" should read -- At --.

Column 21,
Line 2, "pH" should read -- pH --;
Line 4, "pH" should read -- pH --.

Column 22,
Line 9, "0,12 mm)" should read -- 0.12 mm);
Line 57, "steels" should read -- steel --;
Line 58, "1026" should read 1026; --.

Column 25,
Lines 12-18, lines 12-18 should be deleted;
Line 35, <Adhesive" should read -- </Adhesive --.

Column 27,
Table 9, (con't), "1.14" should read -- 1.15 --.

UNITED STATES PATENT AND TRADEMARK OFFICE
CERTIFICATE OF CORRECTION

PATENT NO. : 6,068,755
DATED : May 30, 2000
INVENTOR(S) : Koichi Matsuda et al.

It is certified that error appears in the above-identified patent and that said Letters Patent is hereby corrected as shown below:

Column 28,
Line 55, "and" should read -- an --;
Line 58, "A" should read -- A --;
Line 60, "A" should read -- A --;
Line 67, "ion," should read -- ion; --.

Column 30,
Line 10, "thereon;" should read -- thereon, --.

Signed and Sealed this

Sixth Day of November, 2001

*Attest:*

NICHOLAS P. GODICI
*Attesting Officer*     *Acting Director of the United States Patent and Trademark Office*